United States Patent
Fernandes Ramos

(10) Patent No.: US 11,079,790 B2
(45) Date of Patent: Aug. 3, 2021

(54) SEMICONDUCTOR DIGITAL LOGIC CIRCUITRY FOR NON-QUANTUM ENABLEMENT OF QUANTUM ALGORITHMS

(71) Applicant: Synopsys, Inc., Mountain View, CA (US)

(72) Inventor: Hugo Miguel Fernandes Ramos, Moreira da Maia (PT)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 16/553,096

(22) Filed: Aug. 27, 2019

(65) Prior Publication Data

US 2020/0192417 A1    Jun. 18, 2020

(30) Foreign Application Priority Data

Aug. 28, 2018 (EP) .................................... 18020416

(51) Int. Cl.
*H03K 17/92* (2006.01)
*G06F 1/06* (2006.01)
*G06N 10/00* (2019.01)
*H03L 7/08* (2006.01)
*B82Y 10/00* (2011.01)

(52) U.S. Cl.
CPC ............ *G06F 1/06* (2013.01); *G06N 10/00* (2019.01); *H03L 7/08* (2013.01); *B82Y 10/00* (2013.01)

(58) Field of Classification Search
CPC ......... H03L 7/0891; H03L 7/18; H03L 7/093; H03L 7/087; H03L 7/10; H03K 17/92; H03K 19/1952; H03K 3/38; G01R 13/342; G11C 11/44
USPC ................ 327/147–161, 366, 367, 527, 528, 327/291–295
See application file for complete search history.

(56) References Cited

U.S. PATENT DOCUMENTS

| | | | |
|---|---|---|---|
| 7,376,547 B2 | 5/2008 | Meredith | |
| 8,972,237 B2 | 3/2015 | Wecker | |
| 2002/0106084 A1* | 8/2002 | Azuma | B82Y 10/00 380/263 |
| 2006/0224547 A1 | 10/2006 | Ulyanov et al. | |
| 2012/0124432 A1* | 5/2012 | Pesetski | G06N 10/00 714/709 |
| 2012/0262212 A1* | 10/2012 | Lin | H03K 5/15013 327/245 |
| 2014/0211895 A1* | 7/2014 | Mikkola | H04L 7/0008 375/354 |

\* cited by examiner

*Primary Examiner* — Quan Tra
(74) *Attorney, Agent, or Firm* — Alston & Bird LLP

(57) ABSTRACT

Circuitry and processes are disclosed that use conventional electronic circuits (comprising, for example, phase locked loops, pulse width modulators, phase modulators, digital logic gates, etc.) to enable quantum algorithms. Such circuitry and processes achieve the requirement for non-quantum devices to enable quantum algorithms: the tensor product entanglement of signals representing quantum states. Such circuitry and processes are readily usable by current Electronic Design Automation tools, to design, verify and emulate applications such as fast, very large number factoring for use in decryption. Also, the independent Claims concisely signify embodiments of the claimed inventions.

8 Claims, 28 Drawing Sheets

| QCU Interface | Ket State Formalism (Probability Amplitudes) |
|---|---|
| $P_0 = \dfrac{\alpha\alpha'}{\alpha\alpha' + \beta\beta'}$ $\varphi_0 = \arg(\alpha)$ $\varphi_1 = \arg(\beta)$ | $\lvert \psi \rangle = \alpha \lvert 0 \rangle + \beta \lvert 1 \rangle$ With $\alpha = e^{i\varphi_0}\sqrt{P_0} \quad \beta = e^{i\varphi_1}\sqrt{1 - P_0}$ |

SEMICONDUCTOR DIGITAL LOGIC CIRCUITRY FOR NON-QUANTUM ENABLEMENT OF QUANTUM ALGORITHMS

CROSS REFERENCE TO RELATED APPLICATIONS

The present application claims priority to EP Application No. 18020416.6, filed Aug. 28, 2018, the content of which is incorporated herein by reference in its entirety.

COPYRIGHT NOTICE

This patent document can be exactly reproduced as it appears in the files of the United States Patent and Trademark Office, but the assignee(s) otherwise reserves all rights in any included original works of authorship in this document protected by copyright law.

SPECIFICATION—DISCLAIMERS

*In the following Background, Summary, and Detailed Description, paragraph headings do not signify limitations. In these writings, the citation or identification of any publication signifies neither relevance nor status as prior art. Paragraphs for which the text is all italicized signifies text that is common to multiple patent specifications filed by the assignee(s). The italicized paragraphs herein are version JUN2019SYN.*

*A writing enclosed in double quotes (" ") signifies an exact copy of a writing that has been expressed as a work of authorship. Signifiers such as a word or a phrase enclosed in single quotes (' ') signifies a term to be defined that it is not to be evaluated for, or has no, meaning in that specific use (for example, when the term 'module' is first defined).*

FIELD OF TECHNOLOGY

The following information is solely for use in searching the prior art. This disclosure has significance in the field of electronics in general, including the following topics:

BACKGROUND

In recent years, the quantum computing industry—an industry trying to enable the powerful techniques of quantum algorithms—has exploded in the global private and public sectors. Both governments and the private sector in the Americas, Europe and Asia are each investing billions of dollars in quantum computing research and development. Part of this is economic, and part of this is national security, as some quantum computing algorithms pose threats to security technologies, such as encryption/decryption (via Shor's algorithm, for example) and completely secure communications.

Introduction to Quantum Computer with Qubits.

The foundation of modern computing is the digital bit, a device with two states that is used to enable Boolean logic (the two states are, for example, a voltage-controlled transistor that is switched between current flow and no current flow). Many forms of quantum computing use qubits ("quantum bits"), the quantum equivalent of a digital bit. Qubits are a two-state quantum system such as a spin-½ particle, a quantum dot or a bidirectional flow of current in a Josephson Junction ring. A qutrit is a three-state quantum system which is enabled, for example, with spin-1 particles.

One mathematical formalism using linear algebra for representing and transforming qubits is based on the bra-ket vector notation invented by Paul Dirac in 1939. A 'ket', typically signified by '$|\psi\rangle$', indicates a vector in a Hilbert space that is a representation of the wavefunction for a qubit. A 'bra', '$\langle\psi|$' is also the representation for a wavefunction, and is the Hermitian (complex conjugate) transpose of the ket $|\psi\rangle$. The general state $|\psi\rangle$ of a qubit consists of two basis states (for example, that could be energy levels of a quantum system, or directions of current flow in a quantum circuit, denoted by $|0\rangle$ and $|1\rangle$ that are orthogonal and unitary, that is, $\langle 0|0\rangle = \langle 1|1\rangle = 1.0$ and $\langle 0|1\rangle = \langle 1|0\rangle = 0.0$. A qubit in a pure state can be written as $|\psi\rangle = c_0|0\rangle + c_1|1\rangle$, where $c_0$ and $c_1$ are complex numbers such that $|c_0|^2 + |c_1|^2 = 1.0$. By using a polar representation for the complex numbers, the general state of a pure 1-bit qubit can be written as $|\psi_1\rangle = \cos(\theta/2)|0\rangle + e^{i\phi}\sin(\theta/2)|1\rangle$, where $0 \leq \theta \leq \pi$, and $0 \leq \phi \leq 2\pi$. The relationships and equations are as shown below:

$$|0\rangle = \begin{matrix} 0 \\ 1 \end{matrix} \quad |1\rangle = \begin{matrix} 0 \\ 1 \end{matrix}$$

$$\langle 0| = [10]$$

$$\langle 1| = [01]$$

$$\langle 0| = |0\rangle^T$$

$$\langle 1| = |1\rangle^T$$

$$|\Psi\rangle = \alpha|0\rangle + \beta|1\rangle$$

$$[\alpha]^2 = 1.0 - [\beta]^2$$

$$\langle\Psi|\Psi\rangle = 1.0$$

$$\langle 0|0\rangle = 1.0$$

$$\langle 1|1\rangle = 1.0$$

$$\langle 1|0\rangle = 0.0$$

$$\langle 0|1\rangle = 0.0$$

$$Prob(|\Psi\rangle \text{ is } |0\rangle) = P_0 = [\alpha]^2$$

$$Prob(|\Psi\rangle \text{ is } |1\rangle) = 1 - P_0 = |\beta|^2 = 1 - [\alpha]^2$$

Let: $\alpha = \cos(\theta/2)$ and $\beta = e^{i\theta}\sin(\theta/2)$

Then: $|\Psi\rangle = \begin{matrix} \cos(\theta/2) \\ 0 \end{matrix} + \begin{matrix} 0 \\ \sin(\theta/2) \end{matrix}$ Shown below some of the standard quantum gates as represented in matrix form, and how the gates transform the two states of a qubit. Sets of these gates are universal, that is, multiple members of such sets are used to enable all quantum algorithms. For example, the set comprising the Hadamard (H), Phase Shift (R) and CNOT gates is universal. Other gates that are used include the X/Y/Z, CPHASE and SWAP gates. For example, FIG. 1A depicts a circuit for a 3-qubit Quantum Fourier Transform (QFT) that uses just two gates, the H and controlled R phase gates, also shown in the below equations. The quantum gates used in the circuit are the Hadamard gate and the controlled phase gate $R_m$, herein in terms of $$H := \sqrt{\phantom{x}} \quad R := \underline{\phantom{xx}} \text{ with } \underline{\phantom{xx}} = \underline{\phantom{xx}}, \text{ the}$$

$2^m$-th root of unity. In the paper, "The universality of the Quantum Fourier transform in forming the basis of quantum computing algorithms" (Bowden et alia, *J. Math. Anal. Appl.* 274 (2002) 69-80), it was proved that the QFT is also universal. Any electronic structure that is shown to enable qubits, the seven fundamental quantum gates, and the QFT, is an electronic structure that be used to enable all quantum algorithms. One important use of the QFT is to enable Shor's integer factoring algorithm.

$$H = \sqrt{\phantom{-}} \begin{matrix} 1 & 1 \\ 1 & -1 \end{matrix}$$

$$|0> \rightarrow (|0> + |1>)/\sqrt{2}$$

$$|0> \rightarrow (|0> - |1>)/\sqrt{2}$$

$$X = \begin{matrix} 0 & 1 \\ 1 & 0 \end{matrix}$$

$$|0> \rightarrow |1>$$

$$|1> \rightarrow |0>$$

$$Y = \begin{matrix} 0 & -i \\ i & 0 \end{matrix}$$

$$|0> \rightarrow i|1>$$

$$|1> \rightarrow -i|0>$$

$$R(\pi) = Z = \begin{matrix} 1 & 0 \\ 0 & -1 \end{matrix}$$

$$|0> \rightarrow |0>$$

$$|1> \rightarrow -i|1>$$

$$R(\Phi) = \begin{matrix} 1 & 0 \\ 0 & e \end{matrix}$$

$$|0> \rightarrow |0>$$

$$|1> \rightarrow e|1>$$

$$RR(\Phi) = \begin{matrix} e-/ & 0 \\ 0 & e/ \end{matrix}$$

$$|0> \rightarrow e/|0>$$

$$|1> \rightarrow e/|1>$$

$$CNOT = \begin{matrix} 1000 \\ 0100 \\ 0001 \\ 0010 \end{matrix}$$

$$CPHASE = \begin{bmatrix} 1000 \\ 0100 \\ 0001 \\ 000\text{-}1 \end{bmatrix}$$

$$SWAP = \begin{matrix} 1000 \\ 0010 \\ 0100 \\ 0001 \end{matrix}$$

A ket to represent two qubits is signified, for example, by $|\psi> = c_{00}|00> + c_{01}|01> + c_{10}|10> + c_{11}|11>$, where $|c_{00}|^2 + |c_{01}|^2 + |c_{10}|^2 + |c_{11}|^2 = 1$. The squared magnitude of the 'c' coefficients of the kets represent the probability that the qubit is in the physical state that corresponds to the ket. For example, if $|c_0|^2 = 1.0$, then the qubit is always in the state $|0>$. A pure state qubit has a density matrix $\rho = |\psi><\psi|$, where (the trace) $Tr(\rho^2) = 1$ ($Tr(\rho^2)$ is referred to as its 'quantum purity').

One useful entangled state of 3 or more qubits is the $|GHZ>$ (Greenberger-Home-Zeilinger) state, depicted below. $|GHZ>$ states are quite useful for distributed quantum computing and for quantum communication protocols. Related to the $|GHZ>$ states are $|W>$ states, also useful for quantum computing algorithms.

$$|GHZ> = \frac{|\phantom{x}|\phantom{x}|}{()/}$$

$$= \frac{|\phantom{x}\otimes|\otimes|\phantom{x}\phantom{x}|\otimes|\otimes|}{()/}$$

$$|W> = \frac{|\phantom{x}|\phantom{x}|}{()/}$$

Semiconductor Digital Logic Circuitry for Quantum Algorithms.

Many quantum computer structures pose complicated engineering problems. Many are based on sensitive low-temperature superconducting technology to enable qubits. Many need additional devices to handle quantum problems such as qubit decoherence, quoting IBM: "[Qubits] quickly lose their special quantum properties, typically within 100 microseconds (for state-of-the-art superconducting qubits), due in part to electromagnetic environment, vibrations, and temperature fluctuations." A vast improvement in quantum computing could be achieved if such structures could be built entirely with room temperate semiconductor components, either digital (e.g., logic gates), analog (e.g., operational amplifiers), and/or mixed-signal analog/digital.

Entanglement and Superposition.

Two important quantum effects are superposition and entanglement.

Mathematically, quantum superposition is a linear combination (a Cartesian product) of two or more orthogonal quantum state representations. Since there is freedom of choice of the representation basis (i.e. a minimum, complete set of mutually orthogonal quantum state representations), the same quantum state can mathematically exhibit superposition in one representation basis and at the same time not exhibit superposition in another different representation basis. Classical systems, such as a set of electromagnetic waves or signals, can be superimposed, but when two or more classical members are superimposed, they merge into a new system from which ALL the original members can be obtained (for example using a bandpass filters).

Mathematically, a quantum state of multiple unentangled qubits is the tensor product (often implemented as a Kronecker product) of the quantum state representation of each individual qubit (multiple qubits in an unentangled state are also said to be in a 'separable' or 'product' quantum state). If the quantum state representation of multiple qubits cannot be expressed as a tensor product of the quantum state representations of each individual qubit that composes the system, then the qubits are considered entangled. Entanglement is a phenomenon of correlations.

If you have two classical systems, or two unentangled quantum systems, when you measure one system, that measurement has no correlation with a measurement of the other system. But when the two systems are entangled, their measurements are correlated no matter how far apart the systems are (even when on opposite sides of the universe), which can have implications in light of the theory of special relativity.

Failures to do Quantum Algorithms in Classical Devices.

In 2002, a paper was published, "Superposition, entanglement and quantum computation" (T. M. Forcer, et alia, *Quantum Information and Computation,* 2002, 97-116), in which the authors show how all quantum algorithms can be implemented with 'classical' electronics (they used op-amps), but cannot be done so efficiently (their circuits need an exponentially-rising quantity of electronic components, i.e., for N bits you need $2^N$ components), because of one problem—the lack of multi-particle entanglement for qubits being represented with signals in their electronic circuits. They state the mathematical requirement needed for representation of the quantum states being entangled: "The distinction between Cartesian [product] and tensor product states is precisely the phenomenon of quantum entanglement." Charles Dyson, in his 2011 Master's thesis, "Implementing quantum algorithms using classical electrical circuits: Deutsch, Deutsch-Jozsa and Grover" (Univ. York, Dept. of Mathematics, March 2011), obtains the same results and conclusions using op-amps: classical electrical circuits for important quantum algorithms, but not done so efficiently because of the lack of entanglement. FIG. 1B is a op-amp circuit from Dyson's thesis that implements a Hadamard gate. A group at McGill University, in their paper, "FPGA Emulation of Quantum Circuits" (*IEEE. Int. Conf on Computer Design,* 2004) show how to implement all quantum algorithms using Field Programmable Gate Arrays, a standard digital logic device used heavily in the electronics industry. But they state the same problem due to entanglement: "For an n-input CNOT gate, the number of complex multiplications is $2^n$. This exponential increase becomes a serious issue with entangled systems.".

Bridging the gap between classical and quantum, in 2002, Daniel Gottesman wrote a paper, "The Heisenberg Representation of Quantum Computer", in which he showed how a significant subset of quantum algorithms can be done efficiently on classical computers: "In contrast, for a [computational] network composed of only gates from the Clifford group and measurements of Pauli group operators, the Heisenberg representation provides an excellent method of describing the system . . . . Thus, the time and space required to analyze such a network on a classical computer are polynomial in [the number of bits] n, instead of exponential." In 2002, Leslie Valiant proved much the same with a different set of quantum algorithms in a paper, "Quantum Circuits that can be simulated classically in polynomial time". To appreciate the huge resources needed for these classical approaches to quantum computing, in 2006, a European group published a paper, "Massive Parallel Quantum Computer Simulator", in which they describe a massively parallel processor (with 4096 processors using up to 1 terabyte of memory) to simulate quantum circuits with up to just 36 qubits.

Why the interest in classical digital circuitry for quantum computing? Suppose that one can enable the properties of a quantum qubit with 1000 or so digital logic gates, such as AND/OR/NOT gates. A circuit emulation system such as the Zebu Server 4, available from Synopsys (Mountain View, Calif.), can use its huge array of field programmable gate arrays (FPGAs) to enable not just one qubit using 1000 or so digital logic gates—but over a million qubits for Zebu servers that can enable circuits with billions of digital logic gates. This allows the Zebu server to act as a multi-million-qubit quantum computer, 10,000-times more powerful than the current quantum computers with less than one hundred qubits (for example, IBM's Q System One, circa January 2019, has only 20 qubits and its latest quantum computer has 50 qubits, while Google's quantum computer has 72 qubits). Other emulators that could be used for quantum computing include the Palladium emulators from Cadence and the Veloce emulators from Mentor Graphics.

Not Much Entanglement is Needed.

In 2002, Yaoyun Shi reduced the amount of circuitry needed to achieve quantum computing in classical devices, in his paper, "Both Toffoli and Controlled-NOT need little help to do universal quantum computation", writing: " . . . we prove that Controlled-CNOT plus any single-qubit real gate that does not preserve the computational basis and is not Hadamard (or its alike) are universal for quantum computing." This combination of two gates is simpler than two 3-gate combinations known to be universal: CNOT, Hadamard, π/8; and CNOT plus all of the single qubit gates. Thus, what is needed to show universal quantum computing on classical devices is to verify that the statistics for two classically-enabled gates (CNOT gate, single-qubit real gate) match the statistics of their quantum equivalents.

Simulating a Quantum Computer on a 'Classical' Computer.

As some have shown, enabling entanglement is equivalent to enabling negative probabilities. In 1982, Nobel prize-winning physicist Richard Feynman, in a paper titled "Simulating Physics with Computer" (Int. J. Theor. Phys., vol. 21, 1982, 467-488), argues quantum computing in terms of probability, posing a problem that he could not solve (nor has anyone else in the last 50 years): "The only difference between a probabilistic classical world and the equations of the quantum world is that somehow or other it appears as if the probabilities would have to go negative, and that we do not know, as far as I know, how to simulate." (page 480). He alludes to entanglement in the problem he poses: "There is some kind of correlation of the conditions. Such a formula cannot reproduce the quantum results above for any [factor] if they are real probabilities—negative of some conditions or angles." (page 483).

Measurements of Negative Probabilities.

One representation of quantum probabilities is to use density matrices and/or Wigner functions (Wigner functions and Weyl transforms offer a formulation of quantum mechanics equivalent to that of the standard Schrödinger equation). In 1996, U.S. government scientists experimentally created and measured negative probabilities—"To our knowledge, these are the first experimental reconstructions revealing a negative Wigner function in position-momentum space." (see "Experimental determination of the motional quantum state of a trapped [Beryllium] atom", Physical Review Letters, 18 Nov. 1996). And related to negative probabilities are negative frequencies, again, demonstrated in experiment. In 2012, Italian scientists published a paper, "Negative-frequency resonant radiation" (see Physical Review Letters, 18 Jun. 2012).

Failure Of Others.

To date, all others have failed to enable entanglement of analog/digital signals in circuits that do not grow exponentially for the number of components used or for the amount of time needed for execution. To date, all others have failed to enable tensor product mixing of analog/digital signals representing quantum states in circuits that do not grow exponentially for the number of components used or for the amount of time needed for execution. To date, all others have failed Feynman's computing challenge to build a 'classical' computer than efficiently simulates all of the quantum—" . . . that the number of computer elements required to simulate a large physical system is only to be proportional to the space-time volume of the physical system". To date, all others have failed to provide equations or devices to practically represent and manipulate negative probabilities. To date, all others have failed to provide a 'classical' enablement of quantum qubits that allows quantum algorithms to be implemented on 'classical' devices in circuits that do not grow exponentially for the number of components used or for the amount of time needed for execution.

SUMMARY

This Summary is a prelude to the Detailed Description. This Summary, together with the independent Claims, signifies a brief writing about at least one claimed invention (which can be a discovery, see 35 USC 100(a); and see 35 USC 100(j)), for use in commerce that is enabled by the Specification and Drawings.

Circuitry and processes are disclosed herein that use classical semiconductor devices (such as phase locked loops, ring oscillators, phase modulators, digital logic gates, etc.) to enable new devices based on multiple clock signals to represent qubits, quantum logic operations and quantum algorithms. These quantum logic operations include standard quantum logic operations commonly implemented, for example, as any or all of the following quantum logic gates: Hadamard, Pauli-X/Y/Z, square root of NOT, phase shift, SWAP, square root of SWAP, X/Y/Z-controlled CNOT, Toffoli, Fredkin, Deutsch and the XX/YY/ZZ Ising gates.

Such circuitry and processes use these clock signals to achieve two of the requirements for non-quantum devices to enable quantum algorithms: the effective manipulation of negative probabilities, and enabling the equivalent of quantum entanglement. Such circuitry and processes achieve these requirements with a novel 'classical' semiconductor technology enablement of the heavily-used fundamental element of quantum computing, the qubit, based on the duty cycles and phase relationships of multiple clock signals.

Such circuitry and processes are readily usable by current Electronic Design Automation tools, to design, verify and emulate applications such as fast, very large number factoring for use in decryption. For example, such circuit and processes are useful in commerce for enabling the Quantum Fourier Transform, which in turn enables Shor's algorithm for more efficient factoring of extremely large integers used in encryption and decryption.

This Summary does not completely signify the claimed inventions. This Summary (as well as the Abstract) neither signifies essential elements of nor limits the scope of the claimed inventions enabled by the Specification and Figures.

DRAWINGS

The following Detailed Description, Figures, and Claims signify the uses and advantages of the claimed inventions, and their embodiments. All of the Figures are used only to provide knowledge and understanding and do not limit the scope of the claimed inventions and their embodiments. Such Figures are not necessarily drawn to scale.

Similar components or features used in the Figures can have the same, or similar, reference signs in the form of labels (such as alphanumeric symbols, e.g., reference numerals), and can signify a similar or equivalent use. Further, various components of the same type can be distinguished by following the reference label by a dash and a second label that distinguishes among the similar components. If only the first reference label is used in the Specification, its use applies to any similar component having the same first reference label irrespective of the second reference label. A brief description of the Figures is below.

FIG. 5D depicts some of the electronic circuitry for a phase aligner integrated circuit.

FIG. 13A depicts a classical digital logic circuit for a 1-bit adder, while

Figure 17A:
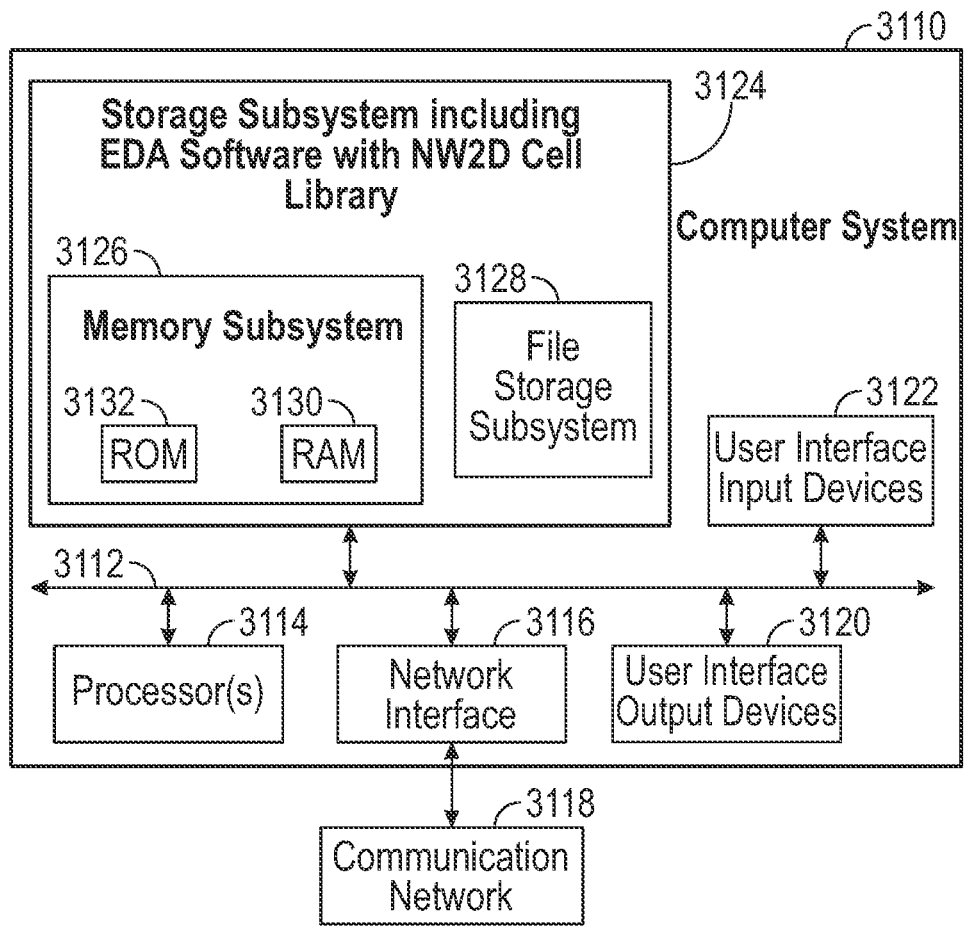
Figure 17B:
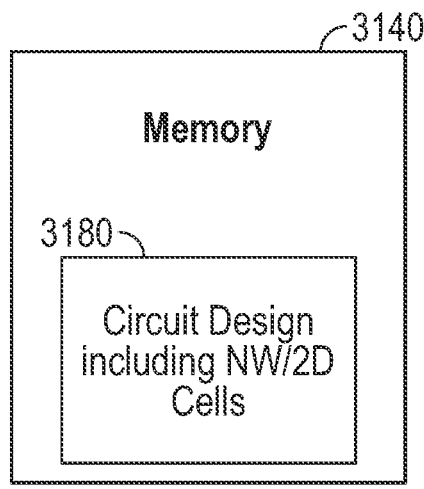
Figure 17C:
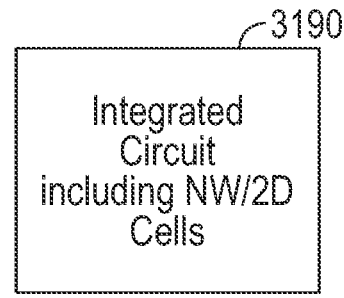

FIGS. 17A, 17B, and 17C depict abstract diagrams of a computer system for use in commerce, if needed, by embodiments of the claimed inventions, as well as an embodiment of a circuit design and an embodiment of a manufactured circuit used in these claimed inventions.

In the Figures, reference signs can be omitted as is consistent with accepted engineering practice; however, a skilled person will understand that the illustrated components when viewed in the context of the Figures as a whole, of the accompanying writings about such Figures, and of the embodiments of the claimed inventions.

DETAILED DESCRIPTION

The Figures and Detailed Description signify, only to provide knowledge and understanding, the claimed inventions. To minimize the length of the Detailed Description, while various features, structures or characteristics can be described together in a single embodiment, they also can be used in other embodiments without being written about. Variations of any of these elements, and modules, processes, machines, systems, manufactures or compositions disclosed by such embodiments and/or examples are easily used in commerce. The Figures and Detailed Description also can signify, implicitly or explicitly, advantages and improvements of the claimed inventions and their embodiments for use in commerce.

In the Figures and Detailed Description, numerous specific details can be described to enable at least one embodiment of the claimed inventions. Any embodiment disclosed herein signifies a tangible form of a claim invention. To not obscure the significance of the embodiments and/or examples in this Detailed Description, some elements that are known to a skilled person can be combined together for presentation and for illustration purposes and not be described in detail. To not obscure the significance of these embodiments and/or examples, some well-known processes, machines, systems, manufactures or compositions are not written about in detail. However, a skilled person can use these embodiments and/or examples in commerce without these specific details or their equivalents. Thus, the Detailed Description focuses on enabling the distinctive elements of the claimed inventions and exemplary embodiments. Where this Detailed Description refers to some elements in the singular tense, more than one element can be depicted in the Figures and like elements are labeled with like numerals.

In the embodiments disclosed herein, the term 'conventional electronics' signifies electronic circuitry comprising room temperature components such as resistors, capacitors, diodes, light emitting diodes, transistors, oscillators, amplifiers, digital logic gates, integrated circuits, electro-optical devices and other components that have been used in electronic circuits for over 40 years. Such circuitry can be chilled to lower than room temperatures. For example, typical electronic devices are designed to operate at temperatures between 0 and 70 degrees Centigrade, while MilTemp devices are designed to operate at temperatures between −55 and 125 degrees Centigrade). In contrast, the "warmest" superconducting quantum devices, using high temperature superconductors, operate at temperatures lower than −135 degrees Centigrade).

In the embodiments disclosed herein, the Python programming language and/or the Verilog hardware description language can be used to specify, verify and/or simulate any subset of the circuitry of the embodiments disclosed herein. Python can be mapped into Verilog using programs such as MyHDL (https://www.myhdl.org) and pyverilog (https://pypi.org/project/pyverilog). While an algorithm implemented in Python will execute at different speed than an algorithm implemented in Verilog (and that a hardware circuit generated from the Verilog specification will execute at a faster speed than its Verilog simulation), one can assume that a Python algorithm's speed will scale up with the same order of N (where N is some parameter of the algorithm/circuit, such as the number of bits) as does the scaling for the speed of the Verilog simulation and its hardware implementation. For example, while a naïve Python implementation of the Quantum Fourier Transform ('QFT') scales in speed on the order of $2^N$, where N is the number of qubits being transformed, and a quantum hardware implementation of the QFT scales as N, the utility of the embodiment disclosed herein is proven if a Python implementation of the circuitry of the embodiments of the inventions disclosed herein also scales as $\alpha N$, where $\alpha$ is greater than 1. Once a circuit or system is optimized through simulations of the Python code, the Python is converted to Verilog, and then a Verilog synthesizer is used to generate a netlist for the circuit or system, and the netlist can be used to configure a Field Programmable Gate Array, or an Application Specific Integrated Circuit, to implement the circuit or system in an electronic device.

Verification of Quantum Computing.

To enable quantum computing with classical semiconductor circuitry ("CSC"), six requirements need to be verified: enabling a qubit with CSC, enabling the measure of the state of such a qubit, enabling quantum operations (such as the CNOT gate) with CSC for individual qubits, enabling multiple qubits with CSC and two-qubit and three-qubit quantum operations, enabling the entanglement of these multiple qubits with CSC, and enabling the measurement of the degree of entanglement of entangled qubits.

Enabling a Qubit with CSC.

If the two states of the qubit are physically enabled as a time-dependent quantum system then the qubit's ket is an eigenfunction of the system's Hamiltonian (often signified by '$\mathcal{H}$'), for which one representation is: $|\psi(t)\rangle = e^{-2\pi i E_0/h t} c_0|0\rangle + e^{-2\pi i E_1/h t} c_1|1\rangle$. $E_0$ and $E_1$ are two energy levels of the physical system that enable the qubit. The complex exponential functions, $e^{i\Theta}$, are phase factors and don't affect the magnitude of the probability coefficients, $c_0$ and $c_1$.

For some of the embodiments disclosed herein, the kets to be enabled in 'classical' circuitry are assigned coefficients/amplitudes with the values $c_0 = \sqrt{P_0} e^{i\phi_0}$ and $c_1 = \sqrt{(1-P_0)} e^{i\phi_1}$. These amplitudes are normalized, i.e., $|c_0|^2 = P_0$ and $|c_1|^2 = 1 - P_0$, so that their sum equals 1.0, indicating that the qubit is always in one of the two states.

For some of the embodiments disclosed herein, each qubit state, $|0\rangle$ and $|1\rangle$, is enabled as a pair of digital clocks with unequal frequencies $f_0$ and $f_1$ with phases $\phi_0$ and $\phi_1$. The clock signals, with frequencies $f_0$, $f_1$ enable the coefficients $\sqrt{P_0}$ and $\sqrt{(1-P_0)}$ by having the average value of the clock's duty cycles equal to the numerical value of the probabilities $P_0$ and $1-P_0$.

Shown below are equations for the two clock signals of a qubits disclosed herein, $clk_0$ and $clk_1$, one clock signal for each qubit state, each qubit state with its own frequency and phase but driven by the same probability, $(f_0, \phi_0, P_0)$ and $(f_1, \phi_1, P_0)$. The average value (the expectation) of the duty cycle for $clk_0$ is $P_0$, and for $clk_1$ is $P_1 = 1 - P_0$ (see below equations).

$$\text{Let: } clk_0 = a = 0.5\,(1 + \text{sgn}(\cos(2\pi f_0 t - \phi_0) - \cos(\pi P_0)))$$

$$clk_1 = \beta = 0.5\,(1 + \text{sgn}(\cos(2\pi f_1 t - \phi_0) - \cos(\pi P_0)))$$

-continued $$P_0 = \text{duty cycle }(clk_0)$$

$$\text{Prob}(|\ >\text{ is }|0>) = <clk\ > = \int^/ ()$$

$$\text{Prob}(|\ >\text{ is }|1>) = <clk\ > = \int^/ ()$$

Figure 2:
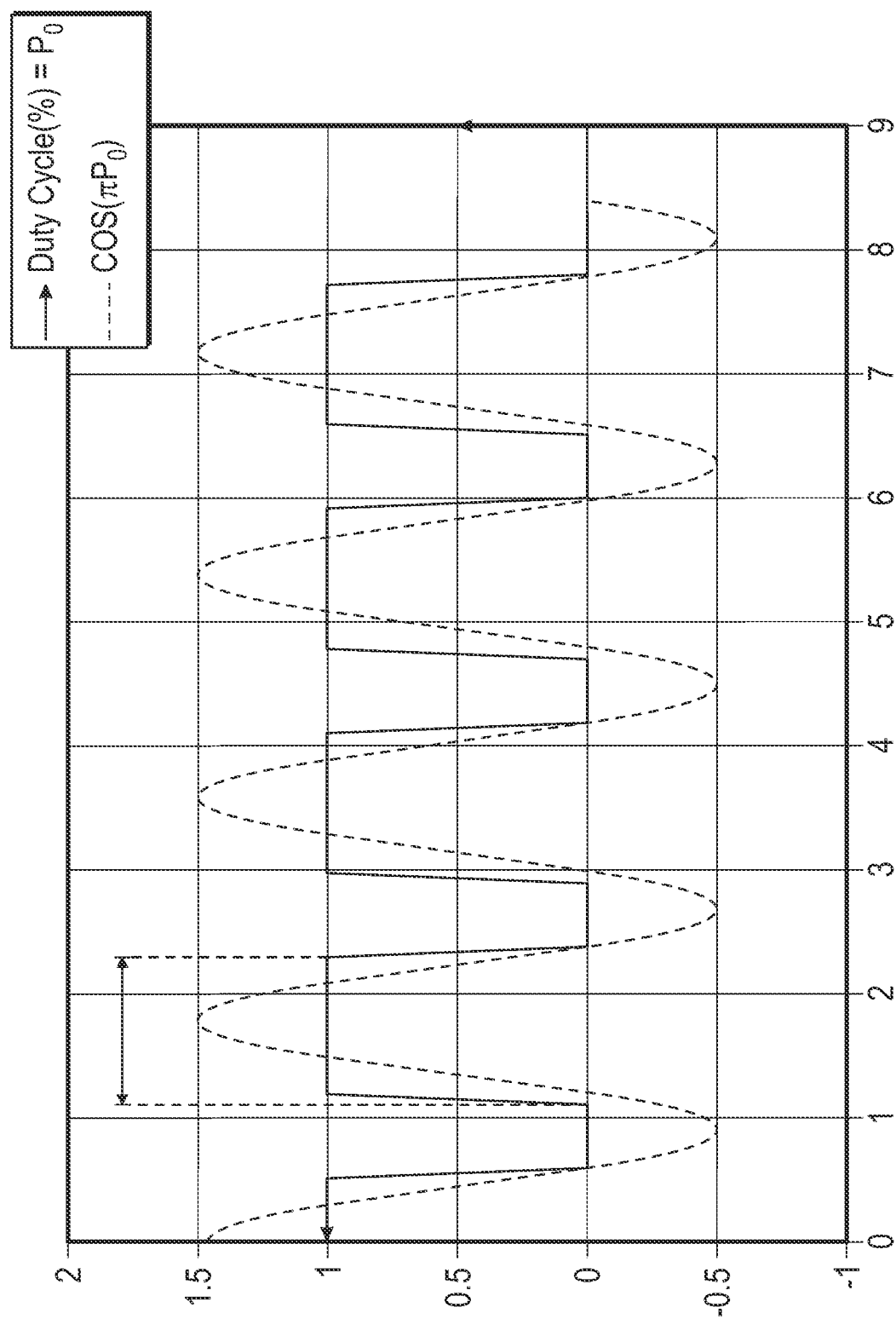
FIG. 2 depicts a sine wave and square wave with a duty cycle.

FIG. 2 graphically depicts aspects of one of the square-wave clock signals generated by the equations described above (the sinusoidal wave signal depicted is for illustration only, and is not used to enable a qubit). The duty cycles are chosen such that the expectation of the clock signals (together the expectation of the qubit states) when calculated analytically or measured electronically, equal $P_0$ and $P_1=1-P_0$.

For a single qubit, the frequencies should not be equal, since the Hamiltonian for the qubit always has 2 different energy levels. For a single qubit, the phase differences between $\phi_0$ and $\phi_1$ never influence the expectation values upon random sampling. When two or more, N, qubits are not entangled (entanglement is discussed below), then the phase factors $\phi_{i0}, \phi_{i1} \ldots \phi_{N0}, \phi_{N1}$ can be arbitrarily specified. As discussed below, if the qubits are partially to maximally entangled, then the phase factors are constrained in value in relation to each other.

The duty cycle for a clock is defined as the fraction of a period of the clock during which the clock is in an active state, and the duty cycle is normally expressed as a percentage, for example, the duty cycle $D_1=PW_1*f_1$, where $PW_1$ is the pulse width when a first clock signal is active and $f_1$ is the frequency of the first clock signal.

One circuit structure to generate these clock signals is to start with a phase-lock loop device (PLL), which generates a digital clock signal that oscillates between two voltage levels, with sharp rise and fall transitions of square waves, and whose frequency is an integer fraction, or integer multiple, of input reference clock frequency. The PLL can be entirely analog, mixed analog/digital, or entirely digital (where the PLL's phase detector, filter and oscillator are digital). The voltage-controlled oscillator in many phase locked loops is structured from a ring oscillator. Other devices to generate these clock signals include digital signal processors, and digital-to-analog converters driven by finite state machines implemented with digital logic.

The choice of frequencies for the clock signals enabling the qubits is arbitrary, and can range from hertz to gigahertz frequencies. The higher the frequencies that are used, the larger the amount of sampling of the final states of the qubits that can be performed, allowing more precise measurements of the probabilities of the final states of the qubits.

Much like the inherent randomness of quantum qubits such as quantum dots, the circuits disclosed herein have a stochastic, random behavior, due to such factors such as clock jitter, undetermined and unconstrained sampling times, different clock frequencies, and varying relative phase differences between the complete set of clocks representing the qubits of the system. Thus, the results of quantum algorithms enabled herein are calculated from an ensemble of circuit output samples that as a whole provide a statistical measure of the results of the quantum algorithm, a statistical measure of the final states. Higher frequencies for the clock signals $f_0$ and $f_1$, with all other things being equal, will result in higher sampling rates and less computational time to obtain ensembles of circuit output samples with similar size, reducing the time needed to obtain a statistical measure of the final state with the same degree of confidence.

For unentangled qubits enabled herein, there is no constraint on the difference in the two frequencies $f_0$ and $f_1$, other than that the two frequencies must be different. Frequency differences for entangled qubits are disclosed below.

Figure 3:
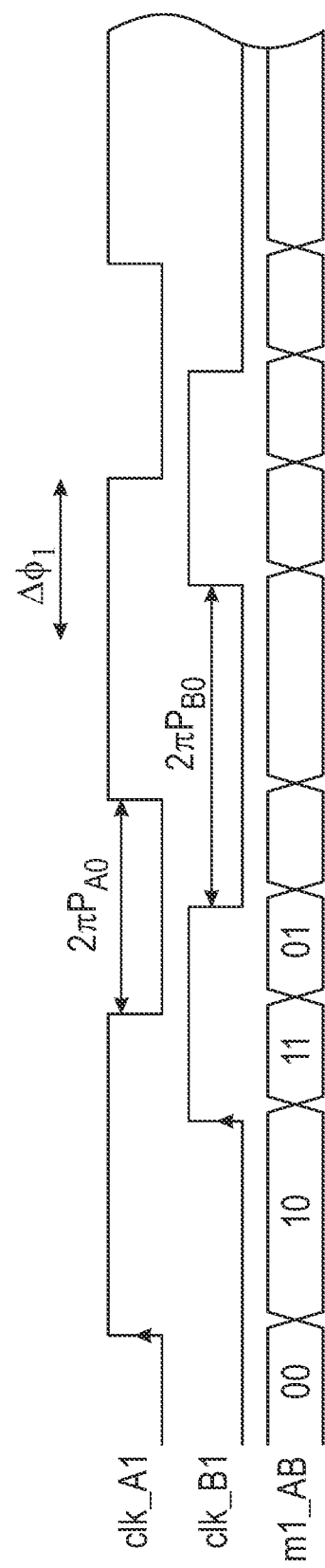
FIG. 3 depicts the waveforms for a pair of clock signals.

Shown below are equations for the clock signal structure for enabling two qubits using the techniques disclosed herein. FIG. 3 depicts a signal graph of the phase and duty cycle relationships between the two sets of clock signals. When the two sets of clock signals represent two coherent qubits A and B, the probability of sampling the clock pair $clk_{A0}/clk_{B0}$ (or $clk_{A1}/clk_{B1}$) in each possible qubit state is determined by the fixed phase difference $(\phi_{B0}-\phi_{A0})$ and the two duty-cycles $1-P_{A0}$ and $1-P_{B0}$.

$$\begin{cases} = \dfrac{1+((2-)-(\ ))}{2} \\ = \dfrac{1+\left(\left(2\ \dfrac{2}{}\ \right)-(\ )\right)}{2} \end{cases}$$

$$\begin{cases} = \dfrac{1+((2-)-(\ ))}{2} \\ = \dfrac{1+\left(\left(2\ \dfrac{2}{}\ \right)-(\ )\right)}{2} \end{cases}$$

with $\neq$ $\neq$ $\neq$

For coherent qubits A and B the probability of sampling the clock pair $clk_{A1}$ $clk_{B1}$ in each possible state is determined by the fixed phase different $\Delta\Phi_1=(\Phi_{B1}-\Phi_{A1})$, and the two duty-cycles $1-P_{A0}, 1-P_{B0}$. The same applies for the clock pair $clk_{A0}$ $clk_{B0}$."

Figure 4A:
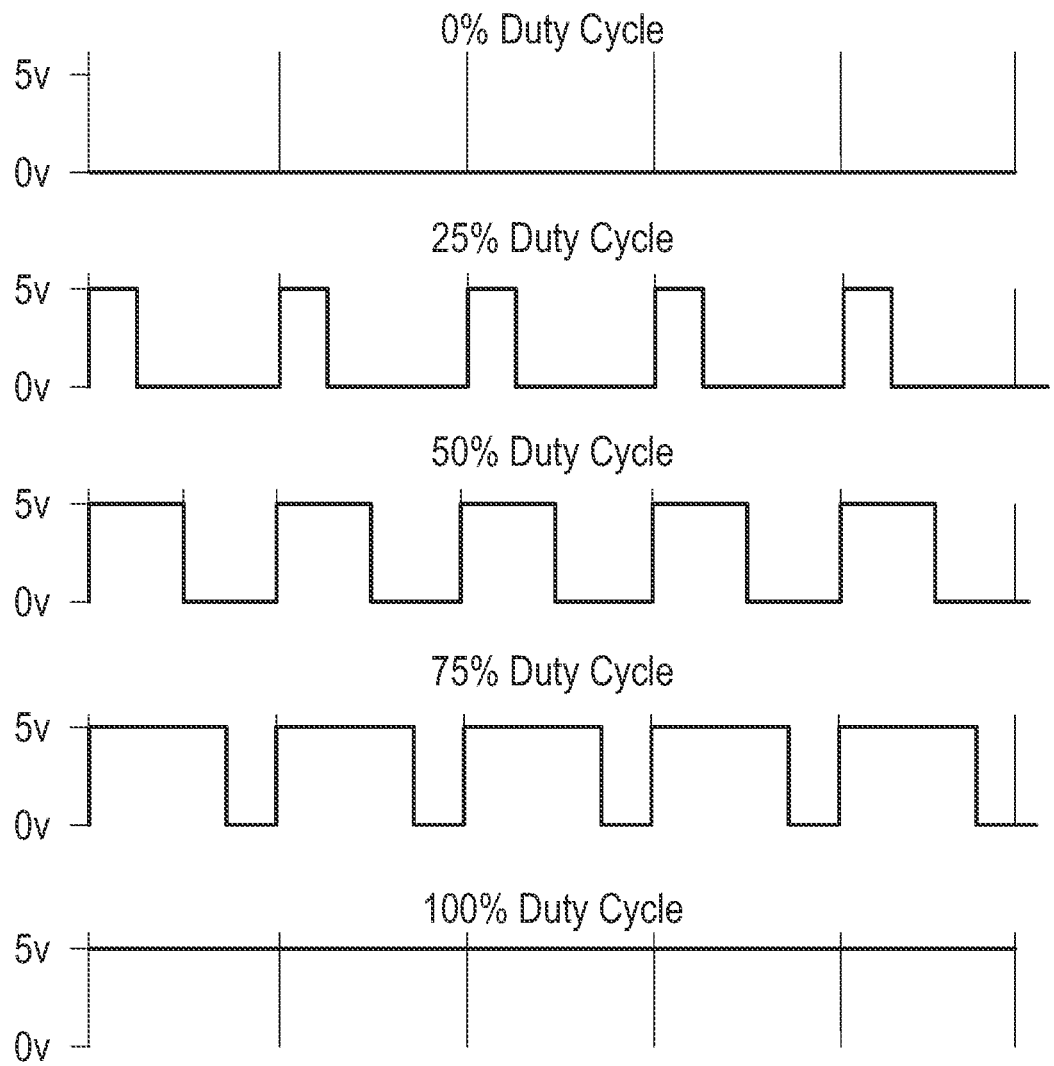
FIG. 4a depicts various duty cycles for square waves.

FIG. 4a depicts some duty cycles for a general square wave, ranging from a duty cycle of 0% (the absence of a signal) to 100% (a signal with no change in its non-zero level, with a 50% duty cycle representing the output of a simple square wave oscillator with no modulation).

Figure 4B:
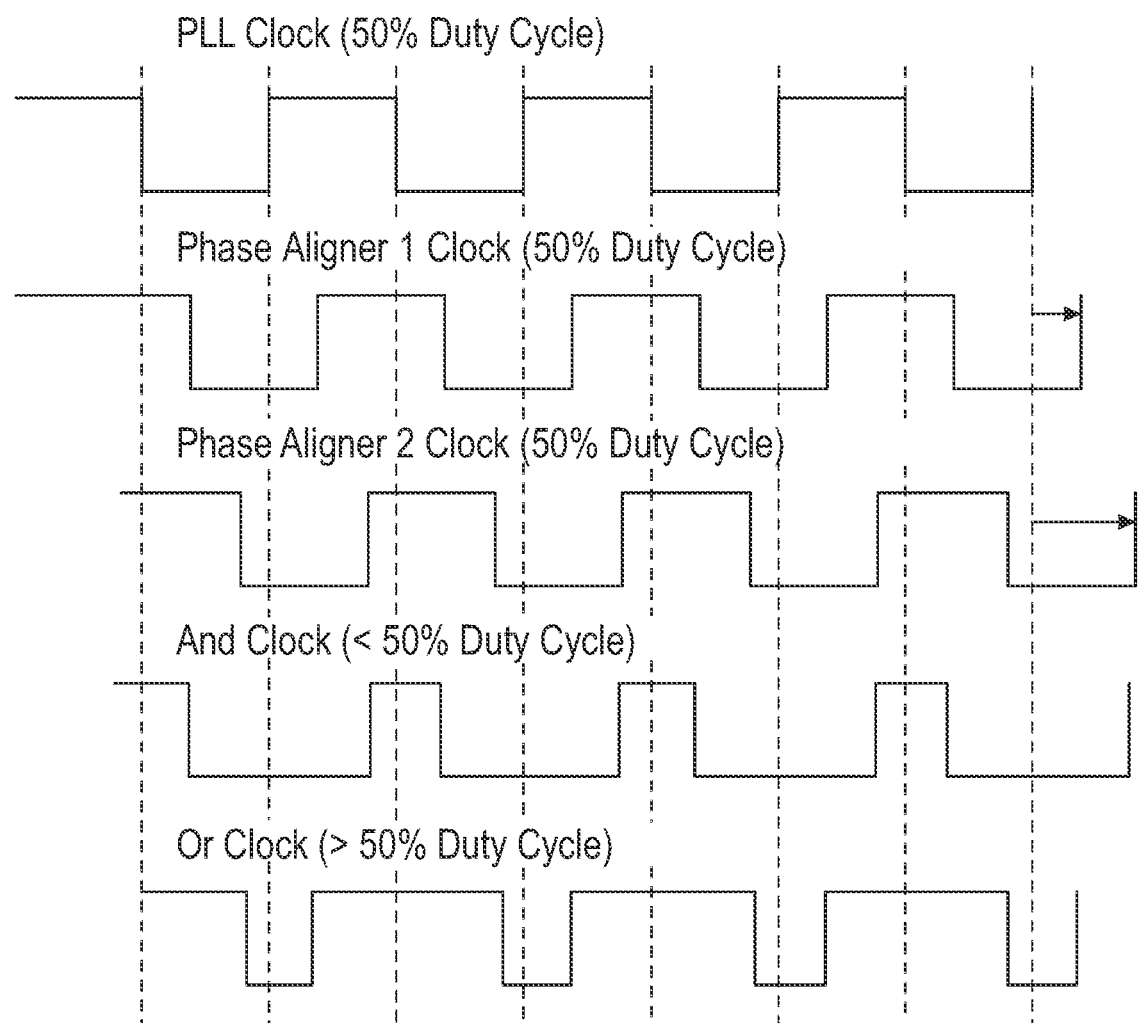
FIG. 4b depicts various duty cycles for the clock signals disclosed herein.

FIG. 4b depicts some forms of phase adjusting and duty cycle modulation used in the embodiments disclosed herein, for example, the two clock signals $clk_0$ and $clk_1$ described above. First, a square wave generator (for example, a phase locked locked) generates a square wave with a duty cycle of 50%. Two phase aligners are used to adjust the relative phase of two square wave clock signals with the same frequency, as output from the square wave generator. The two adjusted signals are used as inputs to AND and OR gates, which generate clock signals with different duty cycles.

Figure 5A:
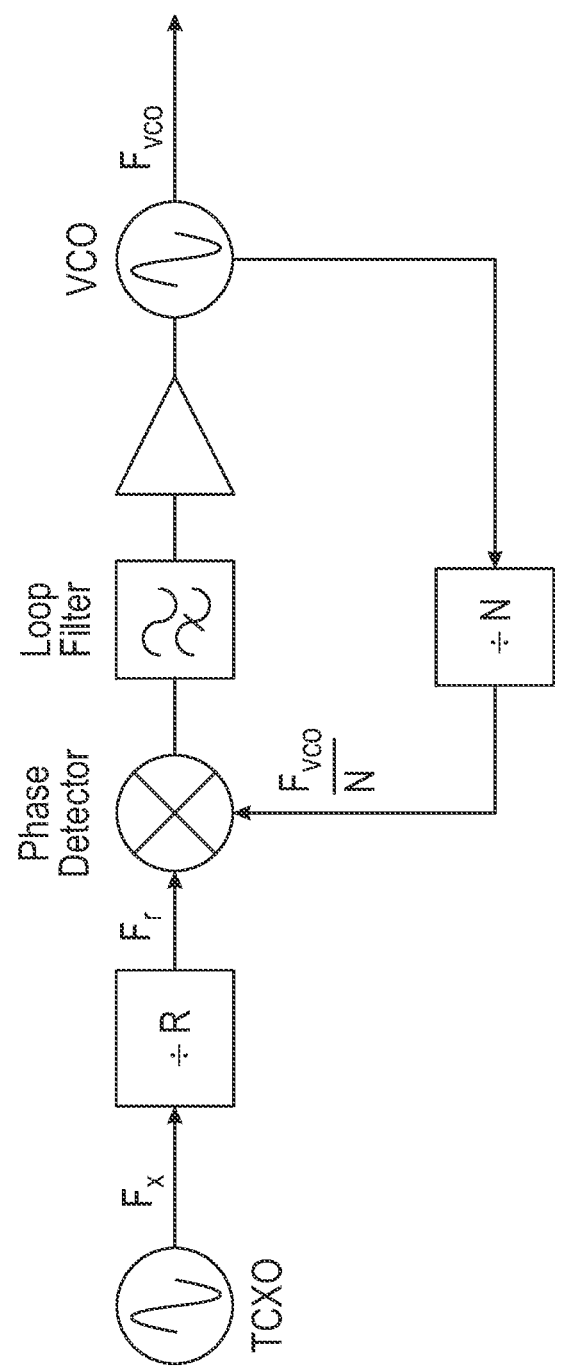
FIGS. 5A, 5B and 5C depict electronic circuits to generate the clock signals for the embodiments disclosed herein.
Figure 5B:
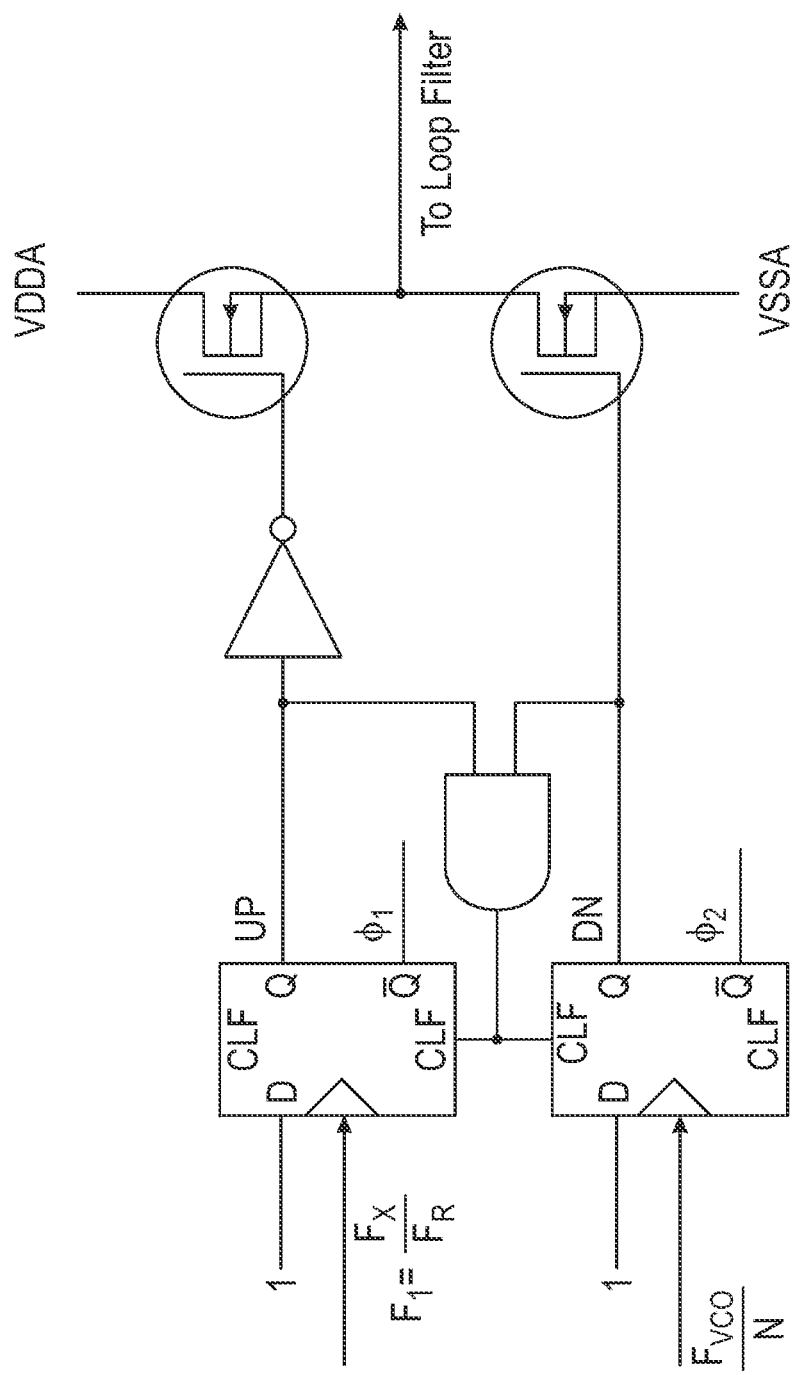
Figure 5C:
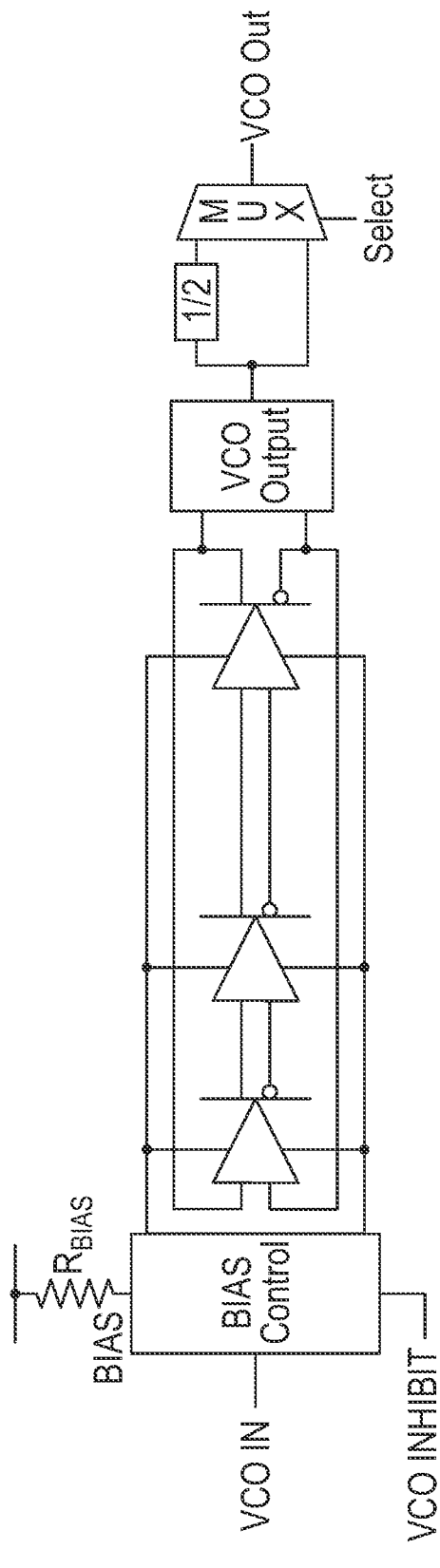

FIGS. 5A, 5B and 5C depict a typical ring oscillator-based PLL structure, with a chain of an odd number of inverters with the output of the last inverter connected to the input of the first inverter. The frequency for this ring oscillator structure is controlled through a feedback circuit that encompasses two frequency dividers, a phase frequency detector circuit, and a low-pass filter. The output frequency of the PLL is given by f_out=f_ref*N/R, where f_ref is the reference clock frequency for the PLL. The output phase sometimes can be controlled using a selector multiplexer ('mux') that selects one of the inverter ring stages as the PLL output. The use of digital logic gates inverters, along with other digital gates for further enablement of the qubits, allows a mostly digital logic structure to be used to enable and control the qubits (analog low-pass filters can be used by the oscillator, for example).

The circuitry of FIGS. 5A, 5B and 5C act on oscillators (TCXO, VCO) until both divided frequencies match. The two frequencies are therefore used in a feedback loop, so that the output frequency of the PLL is stable and based on an external reference input frequency. If the same external reference clock feeds multiple PLLs (for example, f_ref in FIG. 6A) then the clock signals will be coherent. Using larger values for N and R, for example, with N in the range of 100 and R in the range of 300, allows for a large number of rational fractions, N/R, and therefore a large number of output frequencies to be used in the qubits.

The TLC2933A CMOS phase-locked loop chip available from Texas Instruments has an oscillator frequency range of 30 megahertz to 110 megahertz, with a supply voltage between 2.85 and 3.15 volts. Ring oscillators can be designed with sharp rise times, and with frequency ranges into the gigahertz. See, for example, "Design of a voltage-controlled ring oscillator based on MOS capacitance" by Huang Shizhen, et alia (in *IMECS* 2009), which outputs a 2 gigahertz signal.

Any circuit that can generate square waves and multiple frequencies can be used as an alternative to a phase locked loop. For example, a digital signal processor can be programmed to output not only a square wave, but a square wave that is both phase shifted and with a duty cycle more or less than 50%. In another example, a digital-to-analog converter can be used to generate a square wave with an arbitrary duty cycle. Computer programs that simulate qubits using these square waves can generate the square wave by applying a SIGN function to cosine and sine wave calculating processes.

Figure 5D:
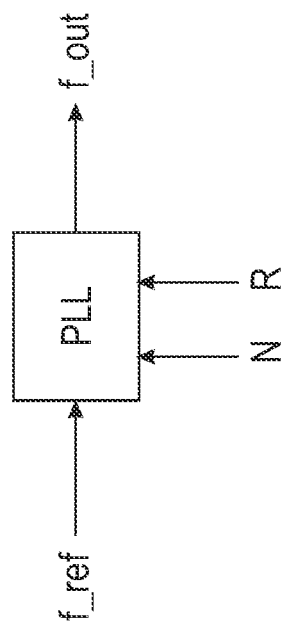
FIG. 5D depicts a block diagram used to represent a phase-locked loop.

FIG. 5D depicts a block diagram for the PLL used herein, or its equivalents, where its digital controlling signals correspond to clock frequency dividers N and R.

Figure 5E:
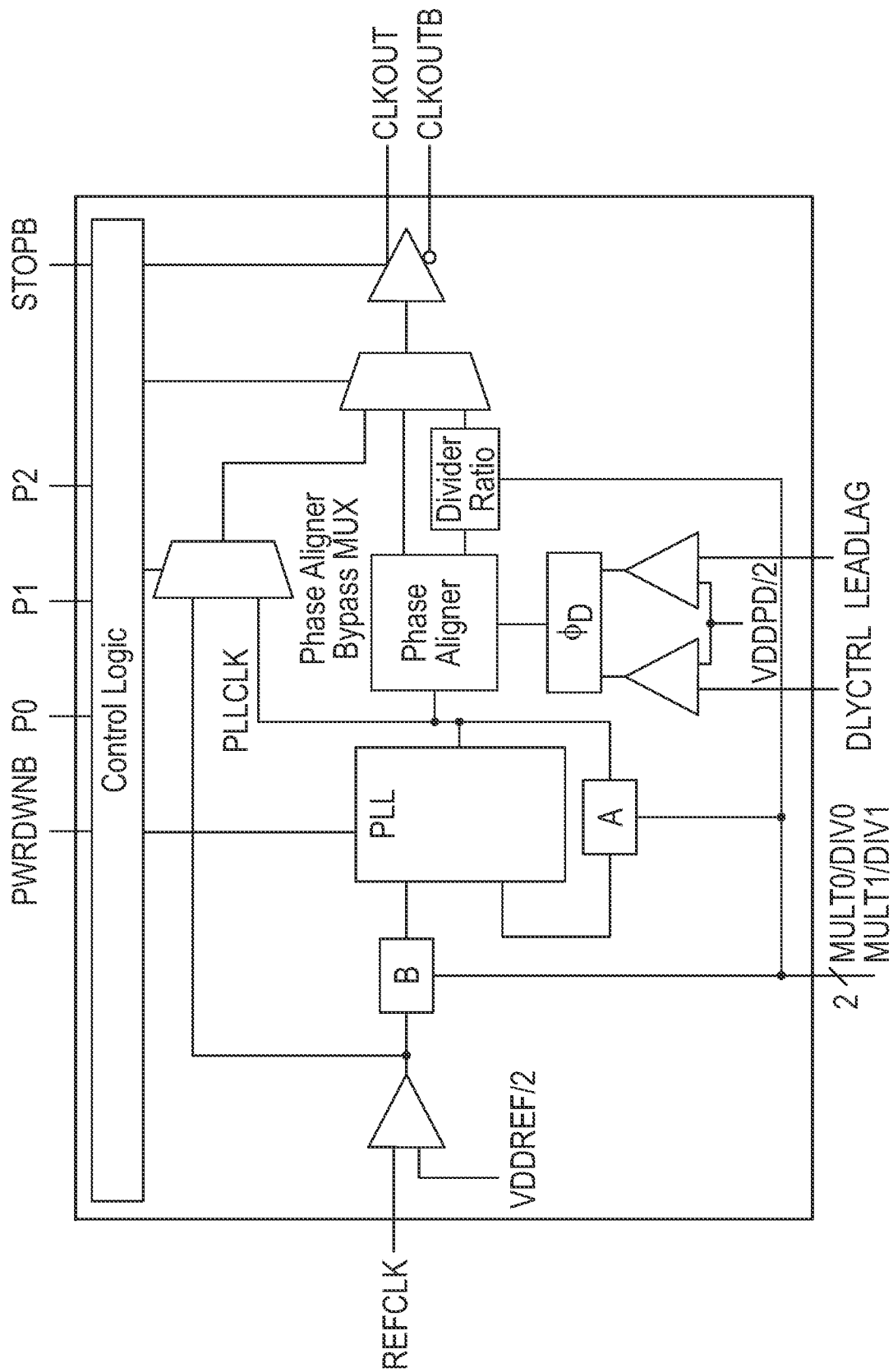

FIG. 5E depicts one phase aligner that can be used for the enablements disclosed herein, the CDC5801A integrated circuit. The CDC5801 provide clock multiplication and division from a single-ended reference clock (REFCLK) to generate two output clock signals CLKOUT (and its inverse CLKOUTB, which is not used in the embodiment disclosed herein, but can be used in other embodiments).

Some of the control signals in FIG. 5E are set as follows: PWRDWNB (active low power down state) is always at a high value. STOPB (active low output disabler) is also always at a high value. Mode control pins P0/P1/P2 always have '0' signals as input, which puts the phase aligner in multiplication mode. The multiple and divide signal lines (MULT0/MULT1/DIV0/DIV1) enable frequency multiplication and division, generate CLKOUT frequencies ranging from 12.5 MHz to 500 MHz with a REFCLK ranging from 19 MHz to 125 MHz. For the embodiments disclosed herein, the MULT0 and MULTI1 are always at a low/0 value, enabling a frequency multiplication by a factor of 4.

The Phase Aligner sub-circuit depicted in FIG. 5E enables the delay or advance of the CLKOUT signal by a delta of 1/384th (about 0.026 percent) of one clock signal, enabling a phase shift relative to the phase of the input clock. Every rising edge on the input pulse signal DLYCTRL increases the amount of delaying or advancing of the CLKOUT signal by 1/384th of the CLKOUT period (and thus has to be preset, which is discussed below). The phase aligners map a 0 to $2\pi$ phase shift factor $\phi$ into the 384 deltas, as controlled by the DLYCTRYL signal line. Thus a phase shift of $\pi$ corresponds to 192 deltas, a phase shift of $\pi/2$ corresponds to 96 deltas. If the LEADLAG control signal is low, the clock signal is delayed (a negative phase shift), while if the LEADLAG control signal is high, the clock signal is advanced (a positive phase shift). When the system is initialized, all phase shift factors $\phi_n$ are set to zero.

The delta represented by 1/384 limits the precision to which arbitrary unitary gates can be approximated, since an arbitrary unitary quantum gate can be represented by a rotation in R^3 (the rotation angles will be defined by pulse widths and phase delay angles, which can only be selected from a discrete set of pre-fixed values acting upon multiple control signals DLYCTRL in a quantum algorithm circuit). The qubit parameters $P_0$, $\phi_0$, and $\phi_1$, needing to represent any of the 384 potential phase shifts for one phase aligner, are stored with at least 9 bits of data, and are transmitted, for example, using at least 9 data lines in parallel, or serially using one data line.

Figures 6A, 6B:
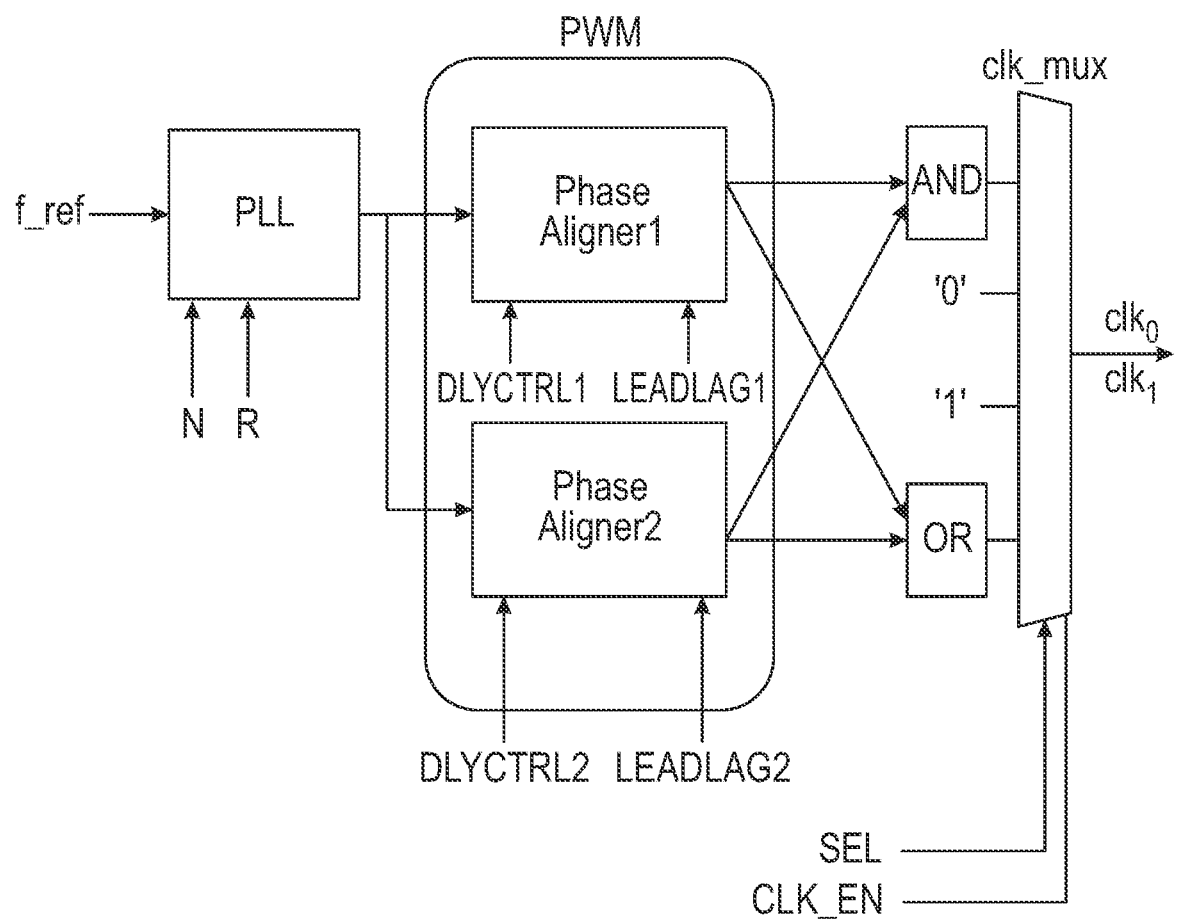
FIGS. 6A and 6B depict an electronic circuit for one of the two clock signals used in a qubit as disclosed herein as well as a truth table associated with the circuit.

FIG. 6A depicts a circuit for generating either of two clock signals ($f_0$, $f_1$) that represent the two states ($|0>$, $|1>$) of a qubit as used in the embodiments disclosed herein. The circuit comprises a combination of a PLL, a pulse-width modulator (PWM) comprising two phase aligners, an AND gate, an OR gate, and a multiplexer circuit that generate either or the two clock signals $clk_0$ and $clk_1$ that correspond to the clock cycles described above. Any equivalent clock signal modulating circuit structure can be used in the embodiments disclosed herein, as long as such modulating circuits generate clock signals corresponding to clock signals $clk_0$ and $clk_1$ described above. In general, representing N qubits in the embodiments disclosed herein will require 2N frequencies and 4N phase shifters, as well as 2N clock multiplexers.

For some of the embodiments disclosed herein, to enable pulse-width modulation, the output of the PLL is connected to two phase aligner circuits, controlled digitally and independently by signals DLYCTRL1 and DLYCRL2. Typically, the output of the PLL is a clock signal with a fixed duty cycle, for example, 50%. While one phase aligner can be used to modulate the phase delay of the output of the PLL, two phase aligners can precisely modulate both the phase delay and the pulse width of the output of the PLL, if the output of the two aligners is connected to a single AND or OR gate.

The PLL and phase aligners can be combined in one electronic structure, for use in the embodiments disclosed herein. For example, U.S. Pat. No. 7,492,850, "Phase locked loop apparatus with adjustable phase shift", which uses XOR phase detectors to generate control signals for weighting the phase differences. For example, U.S. Pat. No. 7,403,073, "Phase locked loop and method for adjusting the frequency and phase in the phase locked loop", uses state machines for phase control.

The output of the aligner circuits are connected to either an AND and an OR gate. With an AND gate you obtain a clock that is active only when both re-phased—but otherwise equal —clock signals from the phase aligners are active. With an OR gate you obtain a clock that is inactive only when both re-phased—but otherwise equal—clocks signals from the phase aligners are inactive. The two outputs—from the AND and from the OR gate, as well as two static signals (defined as "always active" or '1' and "always inactive" or '0'—such static signals allow the PLL to be turned off to save power, and are easier to generate than by adjusting the duty cycles) are connected to a selector circuit that selects which signal (represented as "clk_mux") is present at its output, as depicted in FIG. 6A. The selector circuit is controlled by two signals SEL and CLK_EN that select one of the four inputs as the output, as described in the truth table of FIG. 6A.

The two phase aligners described use the same clock signal from the PLL, a 50% duty cycle, and phase shifts controlled by DLYCTRL1 and DLYCTYL2. Each single phase aligner will output a similar clock with fixed 50% duty cycle, but with individually controlled phases. Only when the output of the two phase aligners are joined in a AND or OR gate is a digital clock signal with the desired duty cycle and phase generated. If the clocks are joined by an OR gate, the duty-cycle will necessarily be between >=50% and <=100%. If the clocks are joined by an AND gate, the duty-cycle will necessarily be between >=0% and <=50%. Only one clock signal (based on a single reference frequency) is the output of FIG. 5D, with two such generated clock signals used to represent one qubit.

Shown below is an exemplary Python class that can be used to generate the clock signals in a simulation computer program ('np' indicates a function called from the NumPy numerical analysis library for the Python language, and 'self' indicates Python code for a qubit referring to itself). The clock signals are first calculated using cosine functions with the frequencies (f1, f2), phases (phi1, phi2) and qubit state probability P0 as the arguments. The results of the cosine functions are then converted into square wave clock signals using the sign function. By evaluating a qubit initialized with these signals, and/or after the qubit is transformed by the quantum gates, the probabilities of the final states can be measured by sampling the qubits at multiple random points in time (via the self.time variable).

```
def simulate(self)
# energy levels (real functions)
e0 = np.cos(2 * np.pi * self.f0 * self.time − self.phase0) − self.p0
e1 = np.cos(2 * np.pi * self.f1 * self.time − self.phase 1) − self.p0
# energy levels (digital clocks)
self.clk0 = np.array(. (np.sign(e0) + 1 / 2), dtype = bool)
self.clkx0 = np.array( − (np.sign(e0) + 1 / 2), dtype = bool)
self.clk1 = np.array(  (np.sign(e1) + 1/ 2), dtype = bool)
self.clkz1 = np.array( − (np.sign(e1) + 1 / 2), dtype = bool)
# z-state measurement (= true/false)
self.z = np.logical xor(self.clk0, self.clk1)
```

Figure 6C:
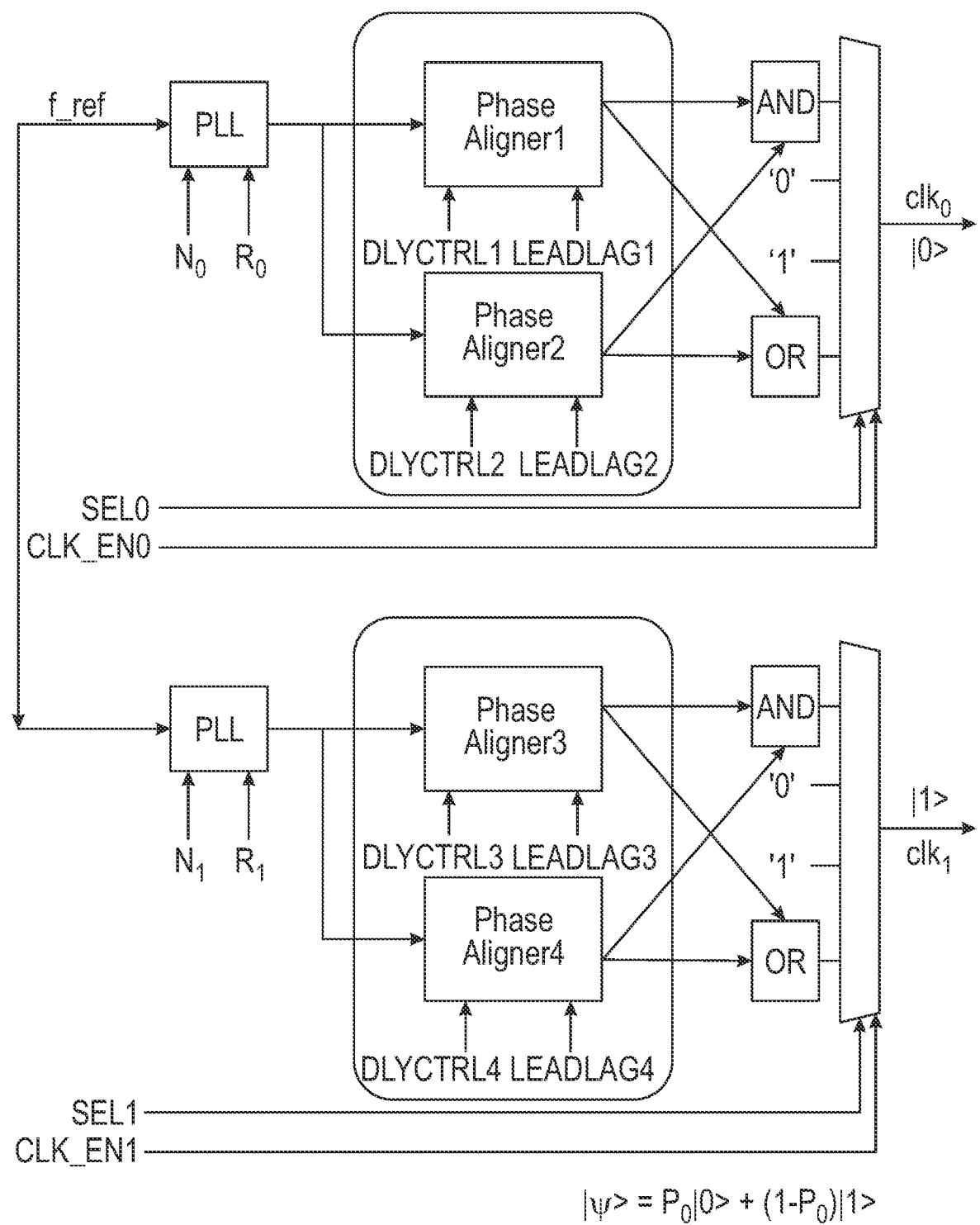
FIG. 6C depicts an electronic circuit for a qubit as disclosed herein, comprising two coupled clock signal generators as depicted in FIG. 6A.

FIG. 6C depicts two (PLL/Phase Aligners/AND-OR) combinations configured to generate the two clock signals that represent the two states of a qubit, based on six control signals: five for the frequencies (f_ref, $N_0$, $R_0$, $N_1$, $R_1$), and one for the probability of the state $P_0$.

Figure 6D:
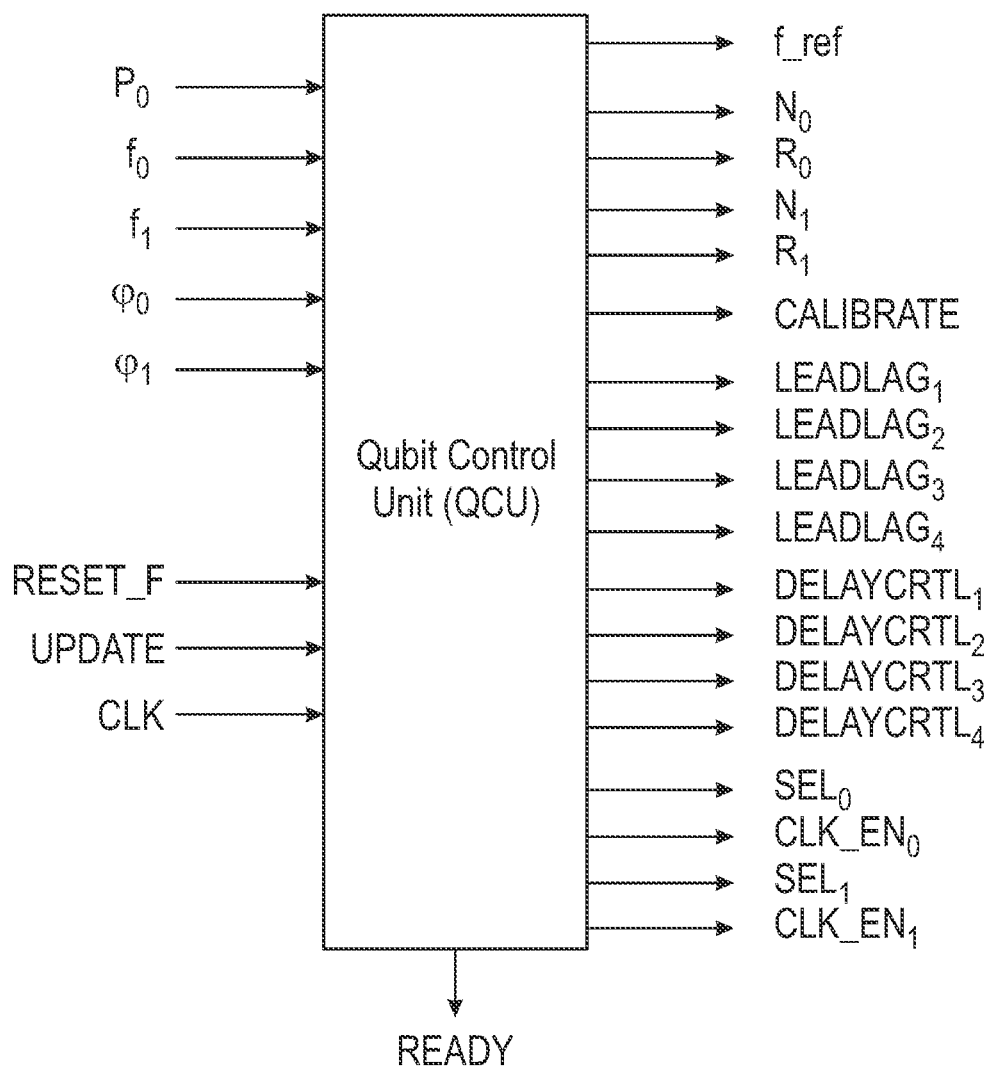
FIG. 6D depicts a block diagram used to represent a Qubit Control Unit (QCU).

FIG. 6D depicts a qubit control circuit (QCU) that takes as input two sets of signals. One set of signals (RESET_F, UPDATE, READY, CLK) are general control signals for an entire quantum algorithm circuit as enabled herein. That is, these signals allow multiple qubits and quantum control gates to be reset, enabled and clocked with shared signals. The other set of signals ($P_0$, $f_0$, $f_1$, $\phi_0$, $\phi_1$) control the properties of an individual qubit. The outputs of the QCU drive the circuitry depicted in FIG. 6C. The QCU circuit can be enabled using different circuit structures, for example, using a microprocessor, a field programmable gate array, or an application specific integrated circuit. The inputs and output signals for the QCU are defined below:

$P_0$ - a digital representation of the probability that the qubit is measured in state |0>
$\Phi_0$ - a digital representation of the phase of $clk_0$ in radians
$\Phi_1$ - a digital representation of the phase of $clk_1$ in radians
$f_0$ - a digital representation of $clk_0$ frequency (in units of refclk frequency). MSB bits signify multiplier value, LSB bits signify divisor value.
$f_1$ - a digital representation of $clk_1$ frequency (in units of refclk frequency).

MSB bits signify multiplier value, LSB bits signify divisor value.
RESET F - QCU frequency reset signal. It is used to reset the QCU into a known initial state. Upon reset, all PLLs are programmed to the target frequencies according to $f_0$ and $f_1$ values and all CDC5801A chips perform a self-calibration routine to produce an initial phase state position.
UPDATE - QCU update signal. It is used to update the phase aligners and multiplexers according to the values of $P_0$, $\Phi_0$ and $\Phi_1$.
CLK - a running clock for digital logic operation.
READY - this output indicates that the QCU is ready to receive a new update request.
$SEL_0$, $SEL_1$ - control signals for selector multiplexors of $clk_0$ and $clk_1$. The signal state is defined based on the $P_0$ value during the last update request.
$CLK\_EN_0$, $CLK\_EN_1$ - control signals for selector multiplexors of $clk_0$ and $clk_1$. The signal state is defined based on the Po value during the last update request.
LEADLAG1, LEADLAG2, LEADLAG3, LEADLAG4 - control signals for phase aligners 1 to 4. Clock signal ativity is defined based on $P_0$, $\Phi_0$ and $\Phi_1$ values during the last update request.
DLYCNTROL1, DLYCNTRL2, DLYCNTRL3, DLYCNTRL4 - control signals for phase aligners 1 to 4. Clock signal activity is defined based on $P_0$, $\Phi_0$ and $\Phi_1$ values during the last update request.
$N_0$, $N_1$, $R_0$, $R_1$ - control signals for the phase locked loops, based on the $f_0$ and $f_1$ values.
f ref - reference clock signal for the phase locked loops.
CALIBRATE - enables self-calibration for all phase aligners.

Figure 6E:
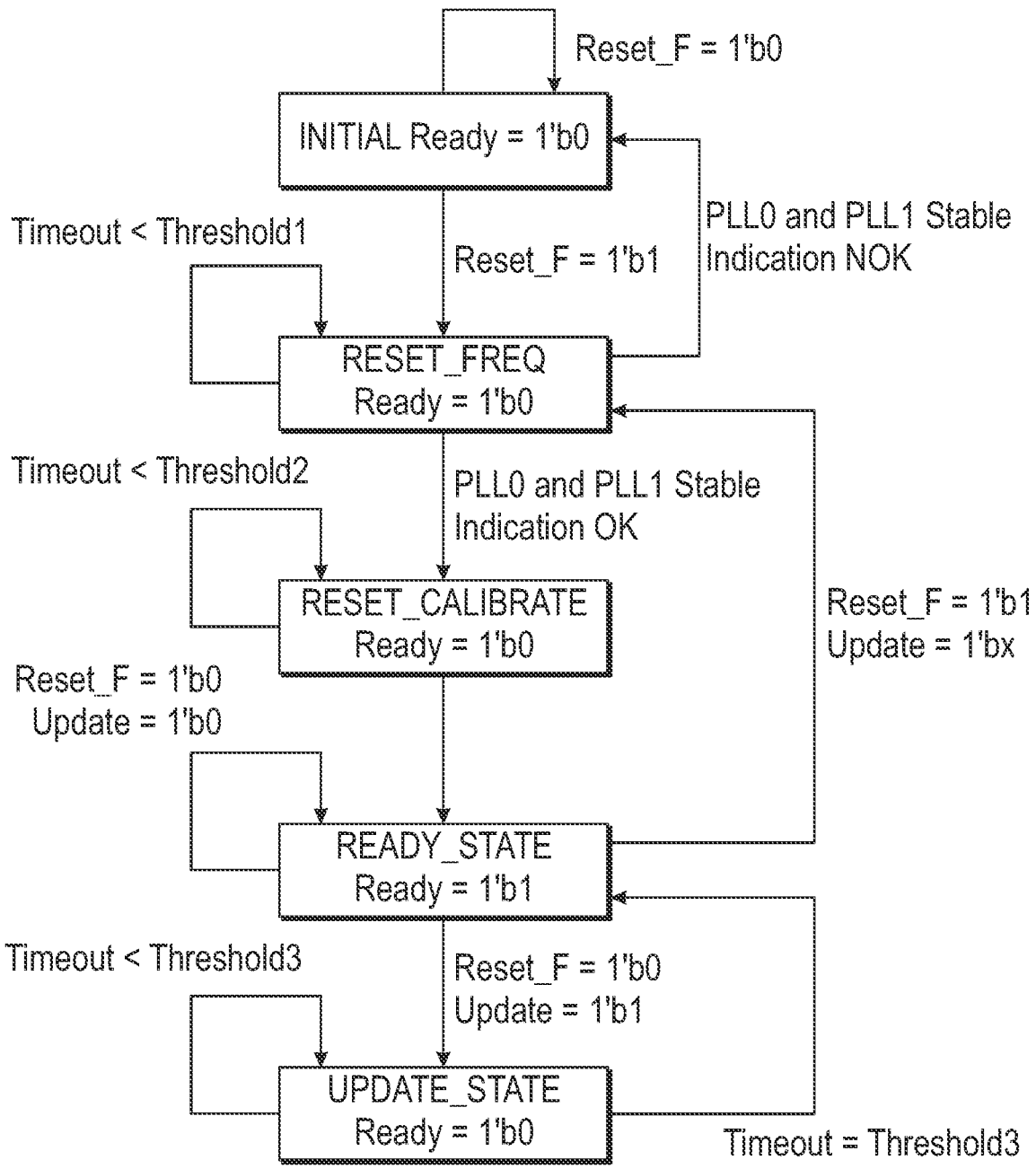
FIG. 6E depicts the finite state machine (FSM) that controls the QCU.

FIG. 6E depicts a finite state machine ('FSM') that is implemented by the QCU and that is used to control a qubit. The FSM performs at least three control operations: 1) Full reset of the Qubit Generator circuitry, including a procedure for updating the frequencies and self-calibrating the phase aligners; 2) Processing update requests for new adjustments of phase aligners based on available input values P0, φ0 and φ1; and 3) Issue an external indication when the Qubit Generator is ready for a new update request.

The FSM has four main states: INITIAL, RESET_FREQ, RESET_CALIBRATE, and READY_STATE.

INITIAL—the Initial STATE. Upon power-up, the FSM is set in this state until a RESET_F request is applied. Next state is RESET_FREQ.

RESET_FREQ—This state is entered when a RESET_F pulse is applied externally to QCU. During this state PLL0 and PLL1, R and N values are programmed according to f0 and f1 inputs of QCU. The state exit occurs after a safe timeout or signal indication that both PLLs are already stable after programming. Next state is RESET_CALIBRATE.

RESET_CALIBRATE—This state is entered after RESET_FREQ exit condition. During this state a phase alignment procedure is applied to ALL phase aligners, according to chip maker application note circuit proposal. The state exit occurs after a safe timeout that guarantees that the output phase clock relative to the input clock is defined. Next state is READY_STATE.

READY_STATE—During this state, Ready output is raised indicating that the qubit generator is ready to accept an update of P0 and phases φ0 and φ1. This state is exited if an Update or an Reset_F pulse is applied. The next states are UPDATE_STATE or RESET_FREQ, respectively.

A few aspects of the FSM should be noted. During the INITIAL and READY_STATE states, the FSM of the QCU does NOT execute any algorithm. When the QUBIT is in the READY STATE, it has reached the target programmability state and is available for the acquisition of measurement statistics. Stable and running clocks (REFCLK and CLK) are assumed, upon powering up the Qubit Control unit block and before any request is applied.

Figure 6F:
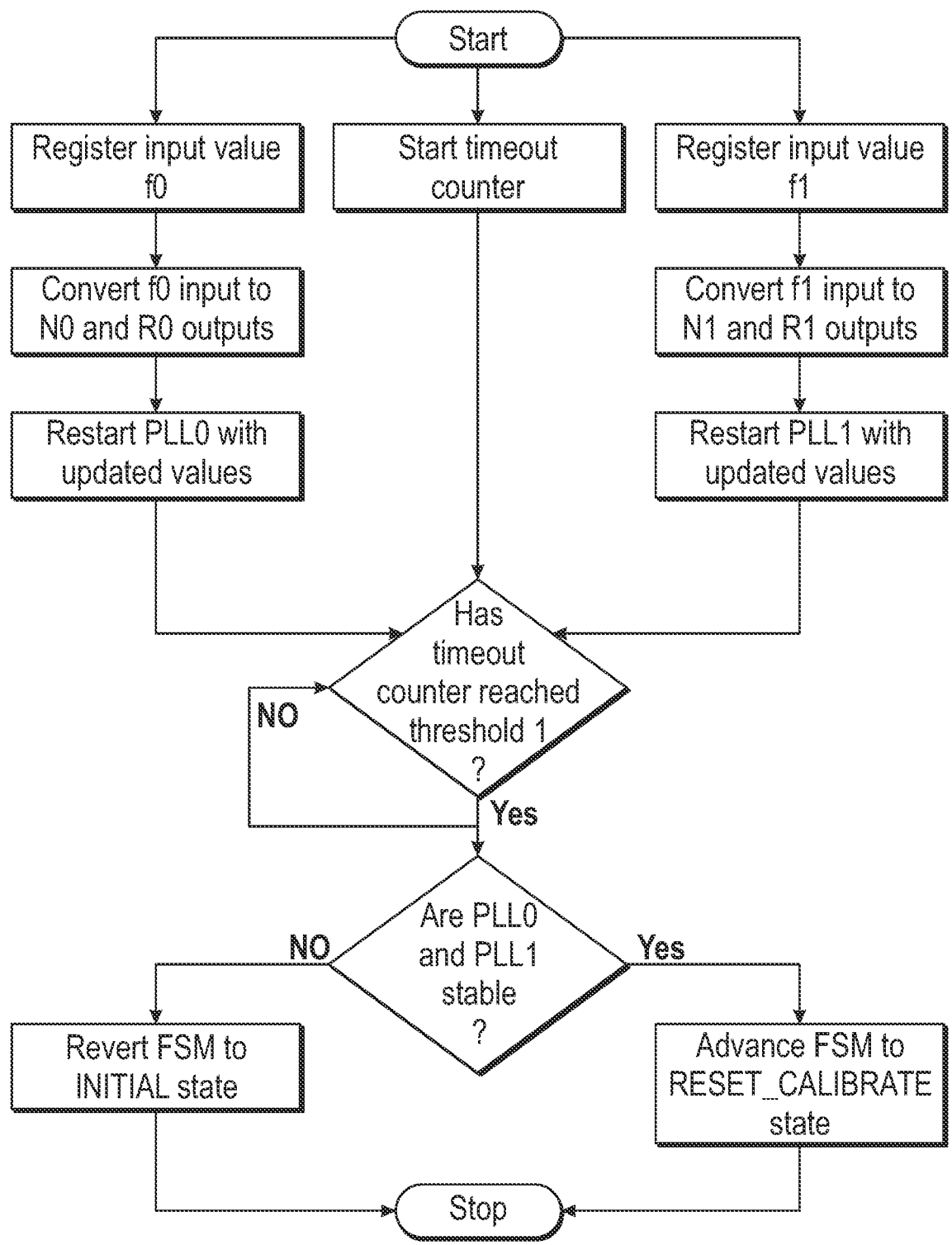
FIG. 6F depicts the frequency reset section of the FSM.

FIG. 6F depicts the processing preformed by the QCU when it is in the RESET_FREQ state. During this state the QCU updates PLL0 and PLL1 values N and R of each PLL.

Figure 6G:
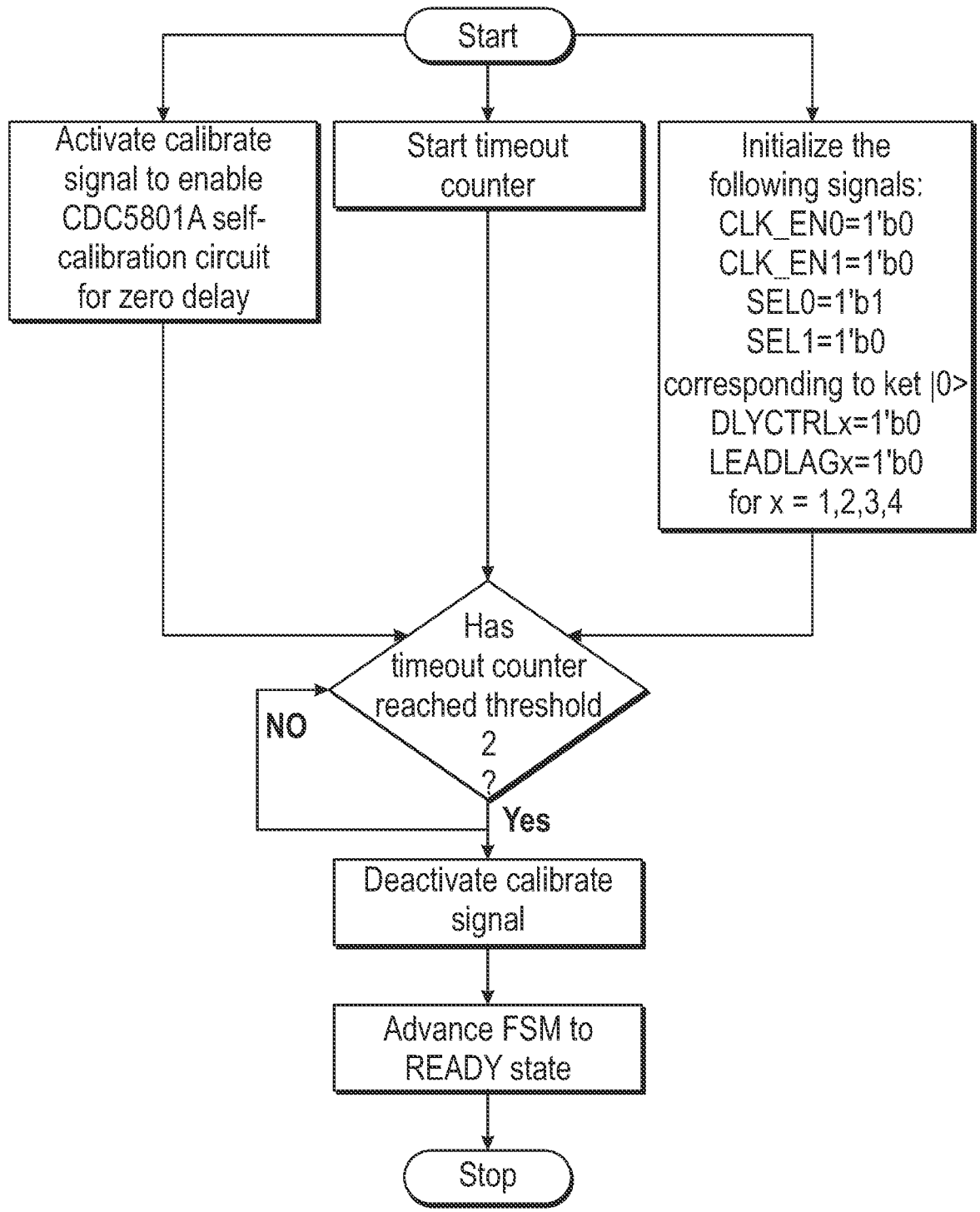
FIG. 6G depicts the calibration reset section of the FSM.

FIG. 6G depicts the processing preformed by the QCU when it is in the RESET_CALIBRATE state. During this state, the QCU alters the configuration of the circuit that controls each phase aligner LEADLAG and DLYCTRL signal in order to enable the phase aligner self-calibration algorithm. The basic process is to use the input and output clocks as direct controls of LEADLAG and DLYCTRL. This circuit configuration is enabled by the QCU using the calibrate signal as a selector of necessary control muxes for the amount of time necessary for the phase alignment procedure to complete.

Figure 6H:
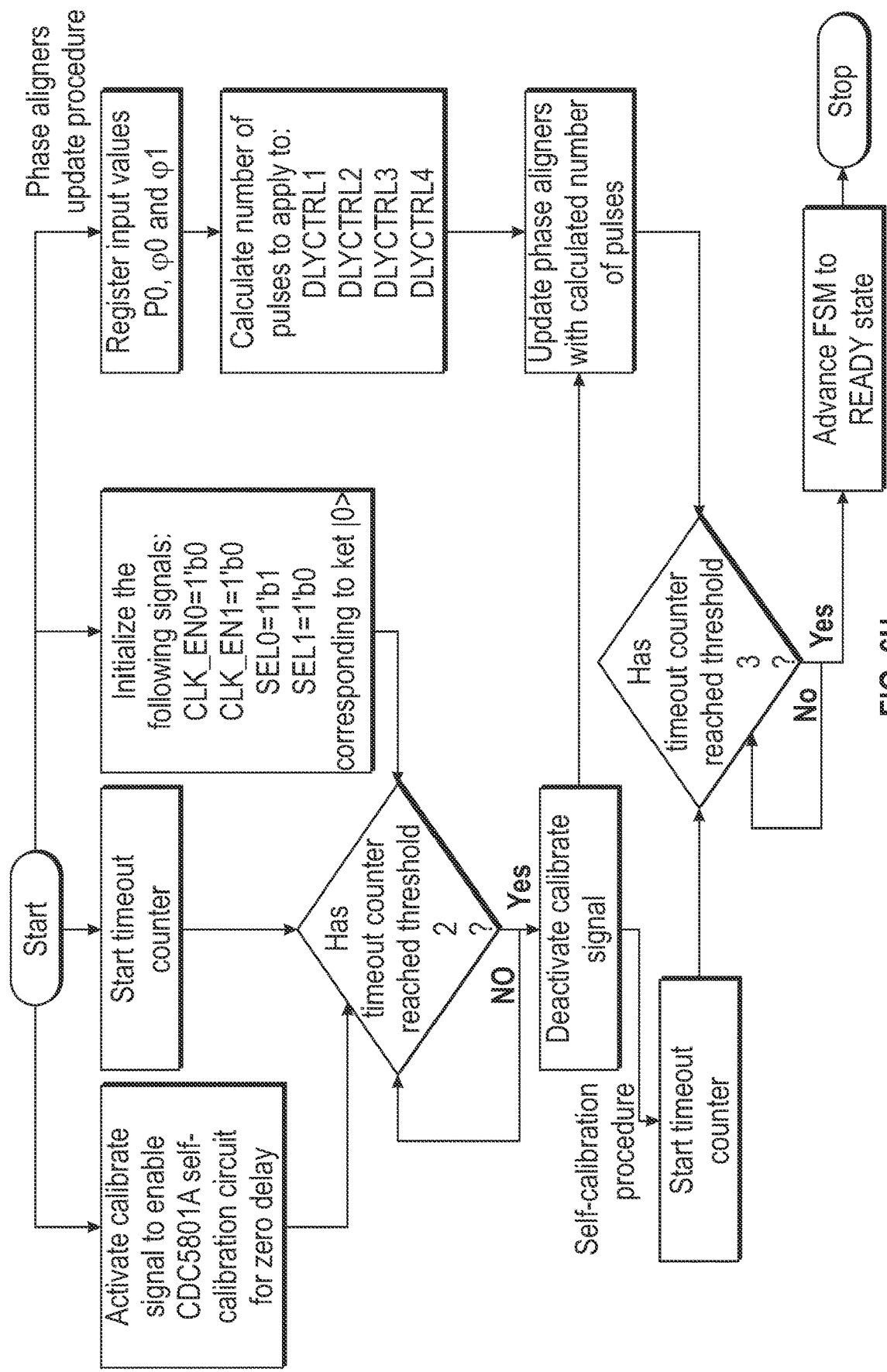
FIG. 6H depicts the update state section of the FSM.

FIG. 6H depicts the processing performed by the QCU when it is in the UPDATE_STATE. During this state QCU block executes several algorithms sequentially or concurrently: 1) Registers all inputs: P0, $\phi 0$ and $\phi 1$; 2) Applies a self-calibration procedure to all phase aligners; 3) Resets timeout counter to reach threshold_3; 4) Calculates the number of DLYCTRL pulses for each phase aligner based on P0, $\phi 0$ and $\phi 1$ according to the formulas below; 5) Applies calculated number of pulses to each phase aligner; 6) Waits for timeout counter to reach threshold_3; and 7) Revert main FSM to READY_STATE.

Figure 6I:
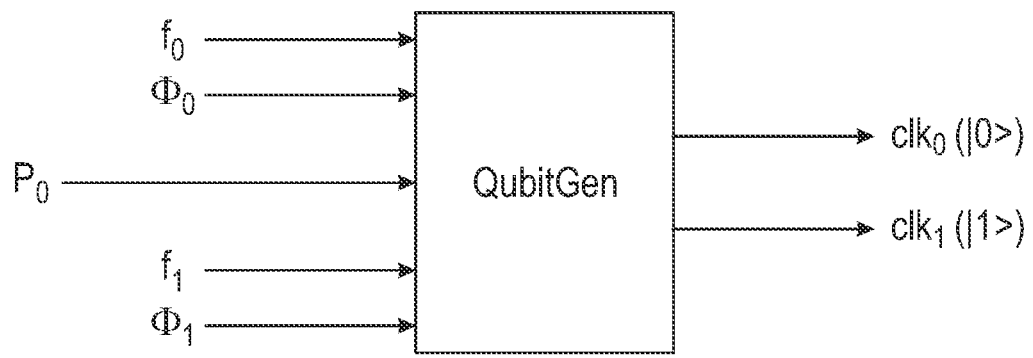
FIG. 6I depicts a block diagram of the entire qubit generator.

FIG. 6I depicts a block representation, used herein in other Figures, for the qubit generator depicted in FIG. 6C.

Figure 7:
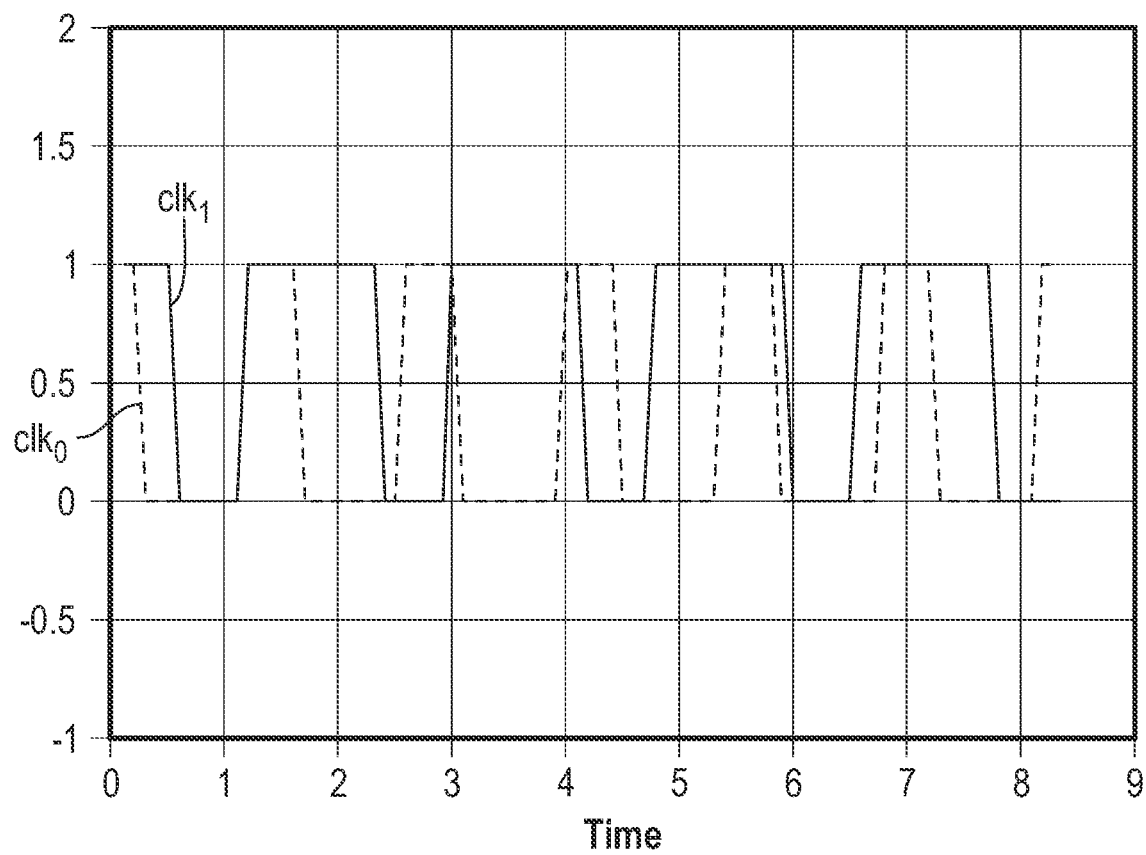
FIG. 7 depicts the two clock signals of a qubit as disclosed herein.

FIG. 7 depicts the superposition of the two generated clock signals, $clk_0$ and $clk_1$—the pulse modulated square waves that represent the state of a qubit. Since each clock has a different frequency, it follows directly from the modulated pulse width characteristics that, upon random sampling, there are 4 possible sample outcomes: $m_{00}$ corresponds to the probability that $clk_0=0$ (low value of the voltage signal) and $clk_1=0$ (low value of the voltage signal) and is equal to $P_0*(1-P_0)$; $m_{01}$ corresponds to the probability that $clk_0=0$ and $clk_1=1$ and is equal to $(1-P_0)^2$; $m_{10}$ corresponds to the probability that $clk_0=1$ and $clk_1=0$ and is equal to $P_0^2$; $m_{11}$ corresponds to the probability that $clk_0=1$ and $clk_1=1$ and is equal to $(1-P_0)*P_0$; where the qubit has a probability of $P_0$ of being in state $|0\rangle$ and a probability of $1-P_0$ of being in state $|1\rangle$. Since the sampling of $clk_0(t)$ and $clk_1(t)$ and produces 4 different outcomes with measurement probabilites $m_{00}$, $m_{01}$, $m_{10}$, $m_{11}$ we can re-arrange these observables to form a 2×2 M maxtrix as follows:

$$= \frac{}{} \sqrt{} = \frac{(1-\ )}{(1-\ )\ (1-\ )}$$

From above it results that $P_0=sqrt(m_{10})$ and $P_0=m_{10}+m_{11}$. Equivalently, it also results that $1-P_0=sqrt(m_{01})$ and $1-P_0=m_{01}+m_{00}$. Therefore, there are multiple combinations of $m_{00}$, $m_{01}$, $m_{10}$ and $m_{11}$, that allow for the efficient computation of $P_0$. For the reference circuitry related to the measurement of the quantum state we now refer to one alternative, while others might be possible. We consider that the qubit to be in state $|0\rangle$, it is necessary that $clk_0=1$ (high value of the voltage signal) and $clk_1=0$ (low value of the voltage signal). For the qubit to be in state $|1\rangle$, it is necessary that $clk_1=0$ and $clk_1=1$.

Due to characteristics of the pair of clocks, it is possible that some of the samples do not correspond to a valid measurement on the z-basis. This results from the alternative chosen and corresponds to a measurement method that in quantum measurement theory could be called as a "weak measurement", i.e. a measurement where, on average, only partial information is obtained about the state of the system per each observation.

For N qubits, the expected ratio of valid samples vs. total samples scales approximately as 1/N. If a system with N qubits is simulated at a rate of 1000 valid samples/second, and if the system increases to 2N qubits, approximately 1000/2 valid samples per second will be obtained—at the same sampling rate, less valid samples will be obtained per second. Thus, the simulation time necessary to obtain a fixed number of samples scales linearly with the number of qubits.

Enabling Quantum Operations for Qubits with CSC

There are a variety of quantum logic gates which can transform a single qubit, including the Hadamard (H), the Pauli-X gate, the Pauli-Y gate, the Pauli-Z gate, the Square-Root of NOT gate, and the Phase Shift gates.

Figure 1A:
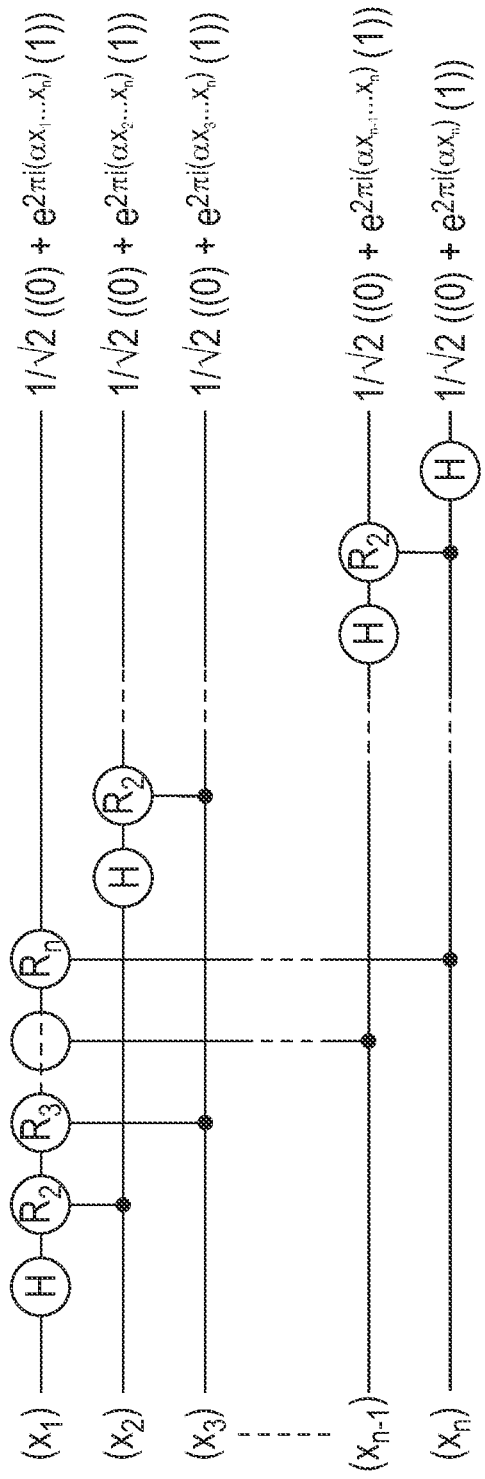
FIG. 1A depicts a quantum circuit for a quantum Fourier transform.
Figure 1B:
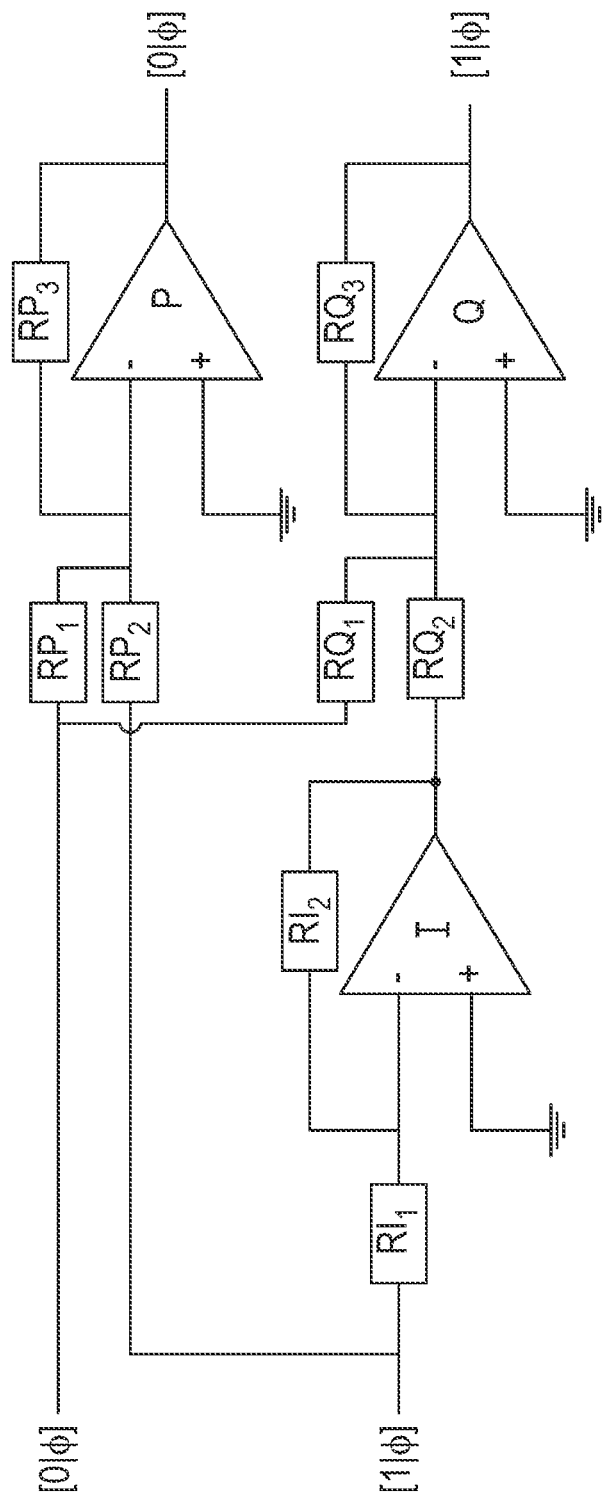
FIG. 1B depicts an operational amplifier circuit that is implementing a quantum gate.

FIG. 1d depicts six single qubit quantum gates represented in matrix operator form: the Hadamard H gate, the XYZ Pauli gates, and the $R(\phi)/R(\phi/2)$ Phase Shift gates. Some of the gates are simple in operation. For example, the Pauli X gate just swaps the two states of a qubit, with $|0\rangle \rightarrow |1\rangle$ and $|1\rangle \rightarrow |0\rangle$. In quantum mechanics literature, the XYZ Pauli gates are also known as the Pauli spin matrices $\sigma_x$, $\sigma_y$ and $\sigma_z$.

For some of the embodiments disclosed herein, the circuitry for the quantum gates only involves a phase shift of one or both of the clocks of a qubit.

Figure 8A:
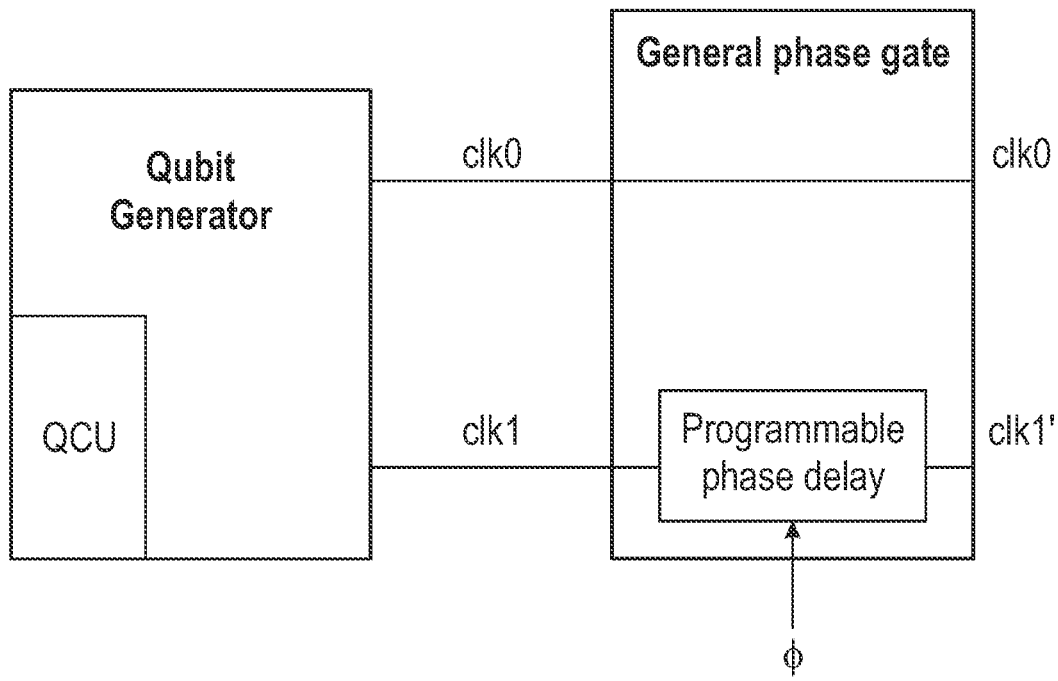
FIG. 8A depicts a circuit to implement a phase shift quantum gate operation.

FIG. 8A depicts the enablement of an R phase gate that has the effect of phase shifting the $f_1/\phi_1$ clock of a qubit. The $\phi$ parameter is not an output of the QCU, but rather is a phase control parameter specific to the quantum algorithm being enabled. For example, the Quantum Fourier Transform circuit of FIG. 1A makes multiple use of a controlled phase shift gate, where $\phi=e^{2\pi i/2^m}$.

The "programmable phase delay" of FIG. 8A is a circuit similar to the Phase Aligner of FIG. 5D, without the multiplication of the frequency by four. We assume below such as circuit that is similarly controlled by DELAYCTRL and LEADLAG signals.

Two quantum gates that can be enabled using the circuitry of FIGS. 8A are the Z and S gates defined below. For the Z gate, the −1 factor is enabled by setting $\phi$ to be $\pi$, while for the S gate, the −i factor is enabled by setting $\phi$ to be $-\pi/2$. A phase delay of $\pi$ for the Z gate corresponds to 192 deltas of the phase aligner, a phase delay of $\pi/2$ for the S gate corresponds to 96 deltas. The negative phase for the S gate is enabled by setting the LEADLAG control signal to low (signal delay), while the Z gate is enabled by setting the LEADLAG control signal to high (signal advance).

$$= \begin{matrix} 1 & 0 \\ 0 & - \end{matrix}$$

$$= \begin{matrix} 1 & 0 \\ 0 & -1 \end{matrix}$$

$$\begin{matrix} 1 & 0 \\ 0 & \end{matrix}$$

Figure 8B:
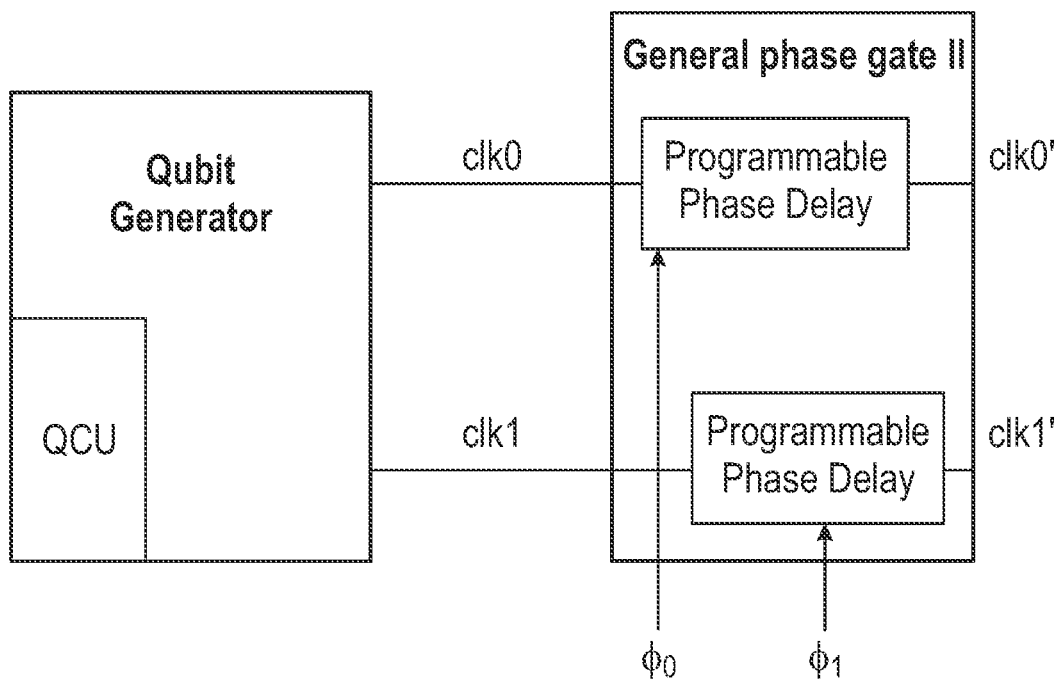
FIG. 8B depicts a circuit to implement a double phase shift quantum gate operation.

FIG. 8B depicts the enablement of a global R phase gate that has the effect of phase shifting both clocks of a qubit. The $\phi_1$ and $\phi_0$ parameters, defined further below, are not outputs of the QCU, but rather are phase control parameters specific to the quantum algorithm being enabled.

For the embodiments disclosed herein, 1-qubit quantum gates are enabled by control of the input parameters of the Qubit generator control unit ('QCU') that was previously described. Mathematical correspondences are established between each quantum computing gate and the input parameters of the QCU, that is, 1) the initial QCU parameters need to be translated into a 1 qubit ket vector, 2) the ket vector is multiplied similarly to the matrix representation of the gate, to obtain the final state of the qubit as a transformed 1-qubit ket vector, and 3) the transformed 1-qubit ket vector is re-mapped into parameters that then update the QCU of the qubit generator so that the ket vector represents the qubit state after the 1-qubit gate is applied.

Figures 9A, 9B:
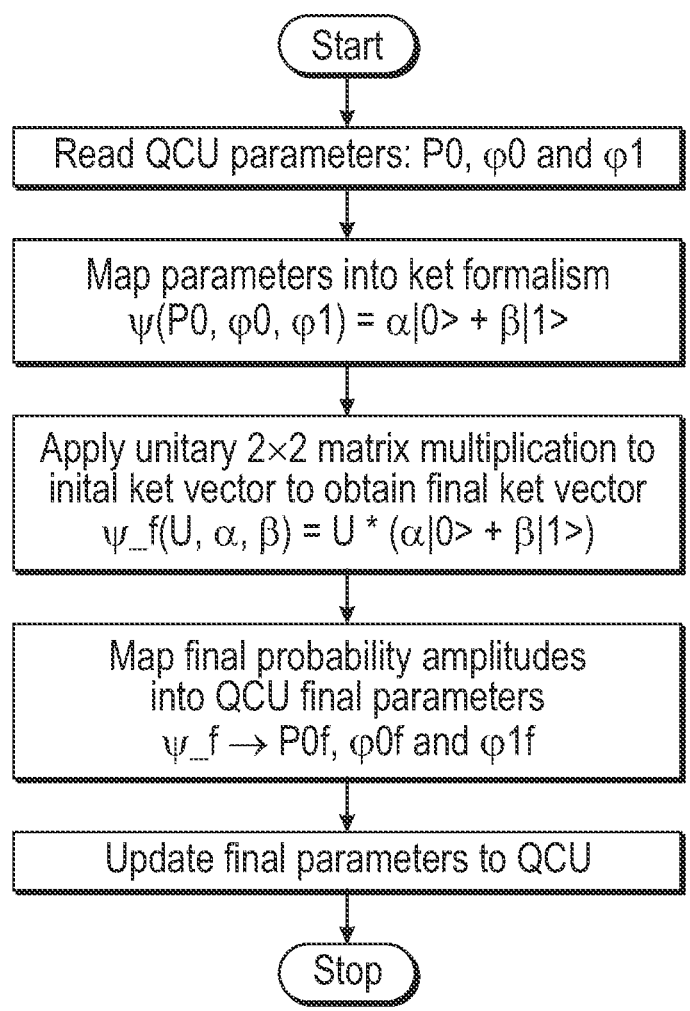
FIGS. 9A depicts, in part, the components of a unitary quantum gate as disclosed herein.
FIG. 9B depicts an algorithm for applying quantum gates to the qubits as disclosed herein.

FIG. 9A specifies the mapping between QCU input and parameters of the ket state formalism (in particular, the probability amplitudes) of a qubit as described herein.

Shown below is the matrix representation of a general unitary 1-qubit gate, for which U*U=1.0 is the constraint to be unitary. Mathematically, given an initial ket $|\psi_i\rangle$ and final ket $|\psi_f\rangle$, $|\psi_f\rangle = U |\psi_i\rangle$.

$$U = e^{i\alpha} \begin{pmatrix} e^{i/} & 0 & /2- & /2 & / & 0 \\ 0 & e^{i/} & /2 & /2 & / & / \end{pmatrix}$$

FIG. 9B specifies a general algorithm for applying unitary transformations that represent 1-qubit gates to qubits as disclosed herein, by controlling the qubit clock signals through the QCU.

Figure 9C:
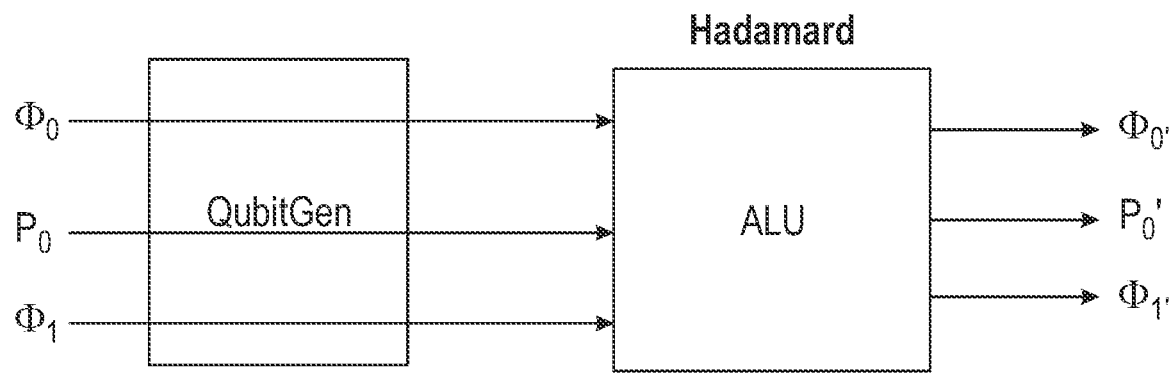
FIG. 9C depicts a circuit to implement a Hadamard quantum gate operation.
Figure 10A:
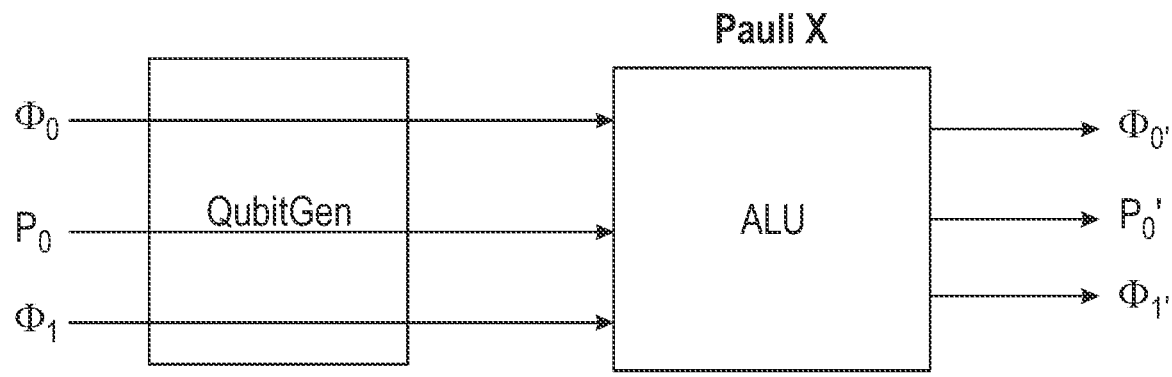
FIG. 10A depicts a circuit to implement a Pauli X quantum gate operation.

FIG. 9C depicts a circuit for performing the Hadamard operation. For this operation, the multibit representations of the qubit state probability and the qubit phases are temporarily converted to complex number representation, the complex multiplication of the Hadamard matrix is performed, and the results converted back to multibit representations for the qubit state probability and the qubit phases. The braces '{' and'}' indicate bitstring conversion to and from fixed point or floating point representation. The ALU processess are shown below:

1. Let $c1 = \exp(i\{\Phi_0\})sqrt(\{P_0\})$ $c2 = \exp(i\{\Phi_1\})sqrt(1 - \{P_0\})$ 2. Let $d1 = (c1 + c2)/sqrt(2)$ $d1 = (c1 - c2)/sqrt(2)$ 3. Let $P_{0'} = \{|d1|^2\}$ 4. Let $\Phi_{0'} = \{\arg(d1)\}$ $\Phi_{1'} = \{\arg(d2)\}$ FIG. 10A depicts a circui for performing the Pauli X operation. This operation performs a simple operation on the qubit probability $P_0$, while doing a simple swap of the qubit phases. The braces '{' and'}' indicate bitstring conversion to and from fixed point or floating point representation. The ALU processes are shown below:

1. Let $P_{0'} = 1 - \{P_0\}$

2. Let $\Phi_{0'} = \Phi_1$ $\Phi_{1'} = \Phi_0$

Figure 10B:
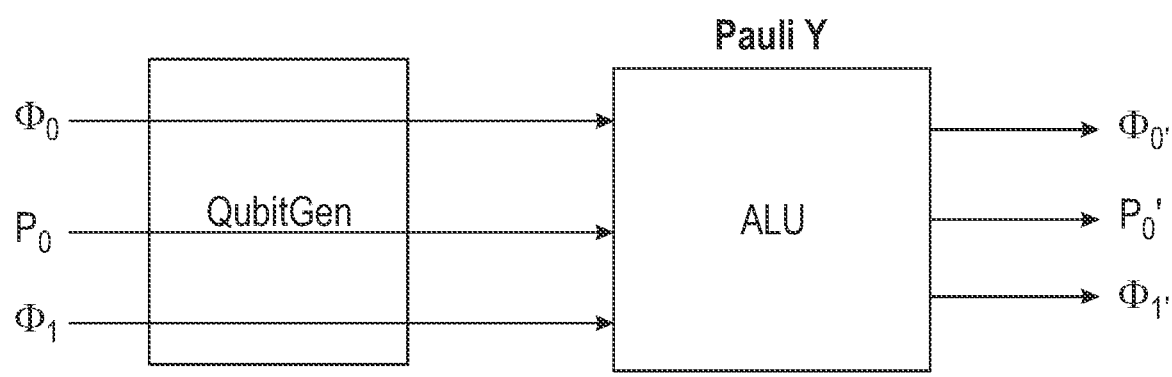
FIG. 10B depicts a circuit to implement a Pauli Y quantum gate operation.
Figure 11A:
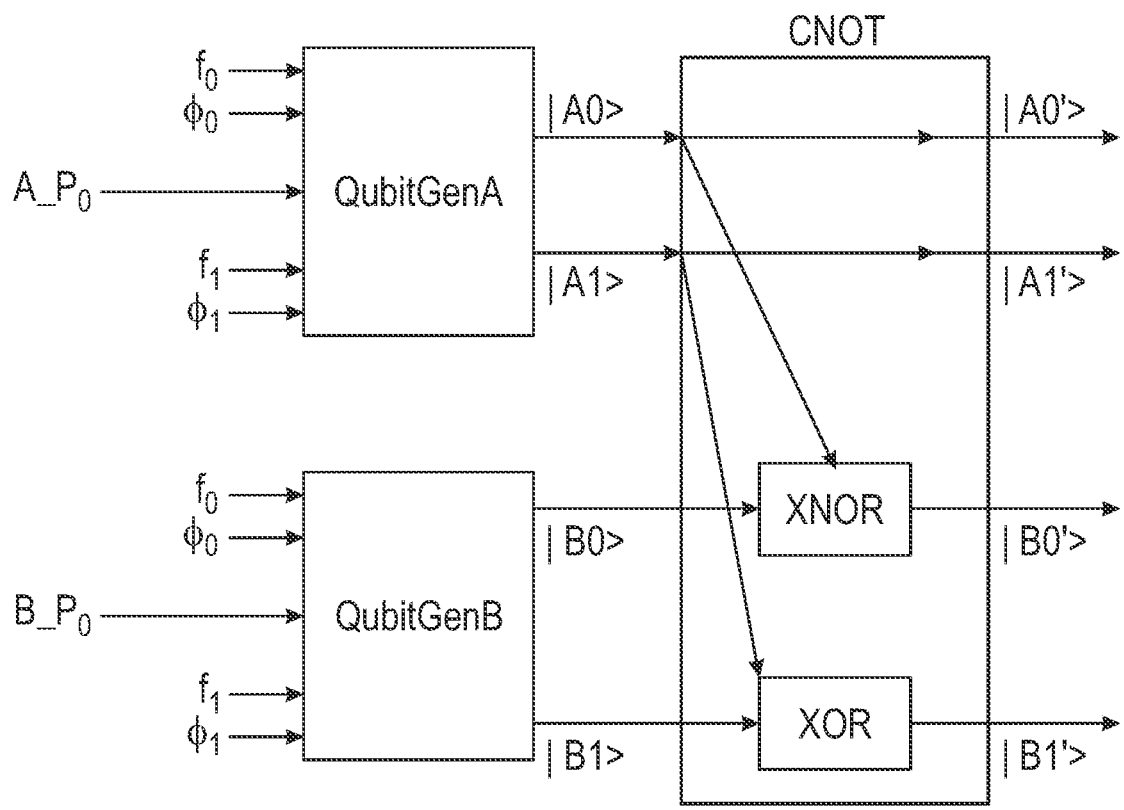
FIGS. 11A and 11B depict a circuit to implement a CNOT quantum gate operation.
Figure 11B:
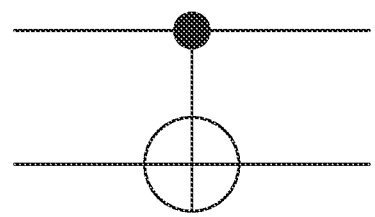

FIG. 10B depicts a circuit for performing the Pauli Y operation. For this operation, the multibit representations of the qubit state probability and the qubit phases are temporarily converted to complex number representation, the complex multiplication of the Hadamard matrix is performed, and the results converted back to multibit representations for the qubit state probability and the qubit phases. The braces '{' and'}' indicate bitstring conversion to and from fixed point or floating point representation. The ALU processes are shown below:

1. Let $c1 = \exp(i\{\Phi_0\})sqrt(\{P_0\})$ $c2 = \exp(i\{\Phi_1\})sqrt(1 - \{P_0\})$ 2. Let $d1 = -i*c2$ $d1 = i*c1$ 3. Let $P_{0'} = \{|d1|^2\}$ 4. Let $\Phi_{0'} = \{\arg(d1)\}$ $\Phi_{1'} = \{\arg(d2)\}$ For example, FIG. 11A depicts two qubits $|A\rangle$ and $|B\rangle$ generated with the circuitry disclosed here, with the qubits then passing through a CNOT quantum gate. All that is needed to enable the CNOT transformation is to enable an XNOR/ZOR operation between corresponding (A0/A1, B0/B1) clock signals, one clock signal from each qubit. One can state the CNOT operation textually as: "If $|A\rangle$ is in an up/1 state, then flip the state of $|B\rangle$, else/otherwise leave $|B\rangle$ unchanged.", making the CNOT gate analogous to the IF/THEN/ELSE branching logic of classical computing.

Figure 12A:
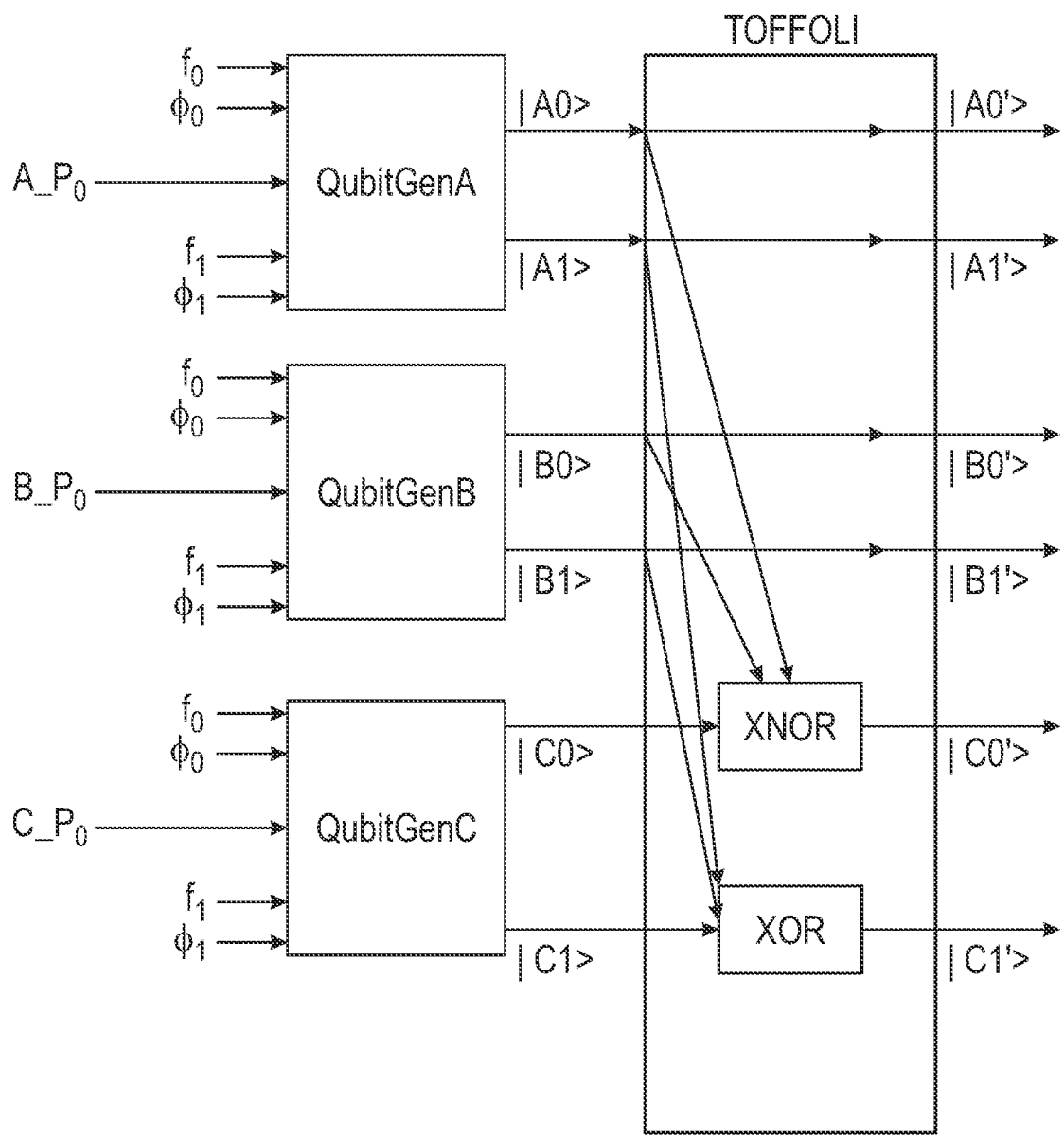
FIGS. 12A and 12B depict a circuit to implement a Toffoli quantum gate operation.
Figure 12B:
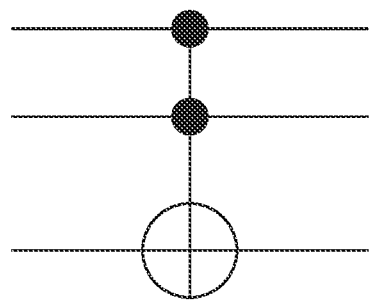

For example, FIG. 12A depicts three qubits $|A\rangle$, $|B\rangle$ and $|C\rangle$ generated with the circuitry disclosed herein, with the qubits then passing through a Toffoli gate quantum gate. The Toffoli gate is a universal gate.

Figure 13A:
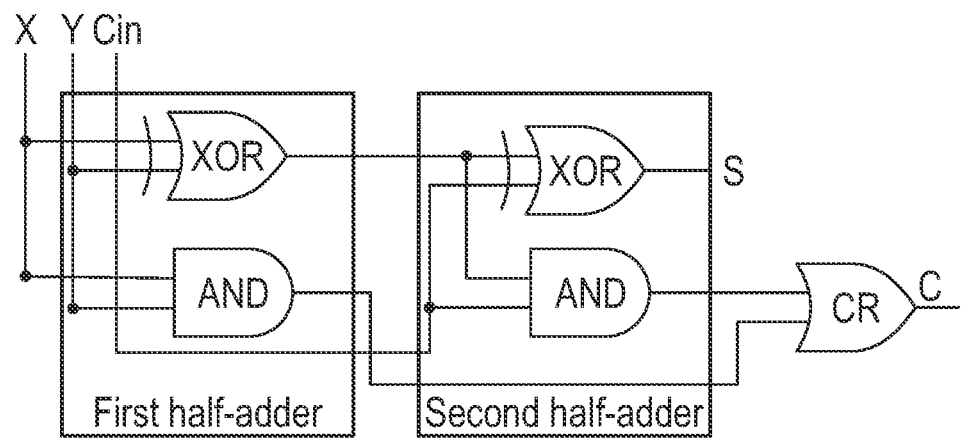
Figure 13B:
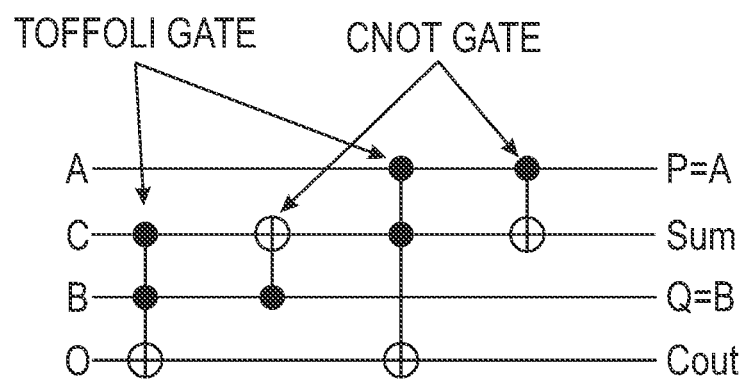
FIG. 13B depicts a quantum gate circuit for a 1-bit adder using the CNOT and Toffoli gates.

For example, FIG. 13A depicts a conventional digital circuit for a full one-bit adder, where S=sum(A+B+Carry_In) and C=Carry_Out. FIG. 13B is a computing equivalent comprising two CNOT gates and two Toffoli gates, a circuit proposed by Feynman. The circuits of FIGS. 13A and 13B are useful for one test of a new quantum qubit technology (necessary but not sufficient for validation).

Figure 14:
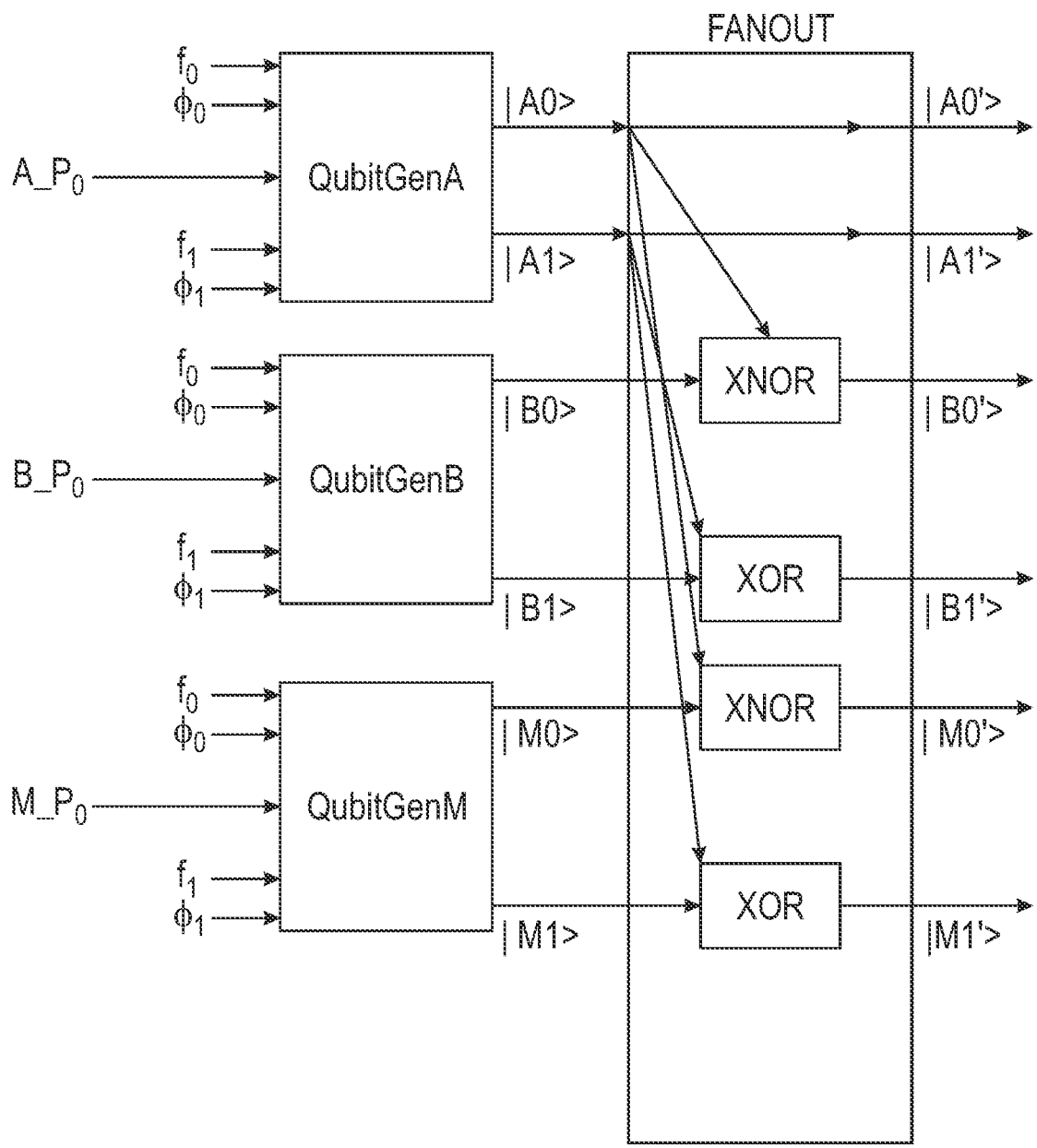
FIG. 14 depicts a circuit to implement the Fanout quantum gate operation.

For example, FIG. 14 depicts three qubits $|A\rangle$, $|B\rangle$ and $|C\rangle$ generated with the circuitry disclosed herein, with the qubits then passing through a fanout gate, where one qubit (here, qubit A) controls two or qubits (here qubits B and M) using the CNOT operation. Fanout gates are useful for reducing the number of gates in a quantum circuit.

Enabling the Measurement of the State of a Qubit

Figure 15:
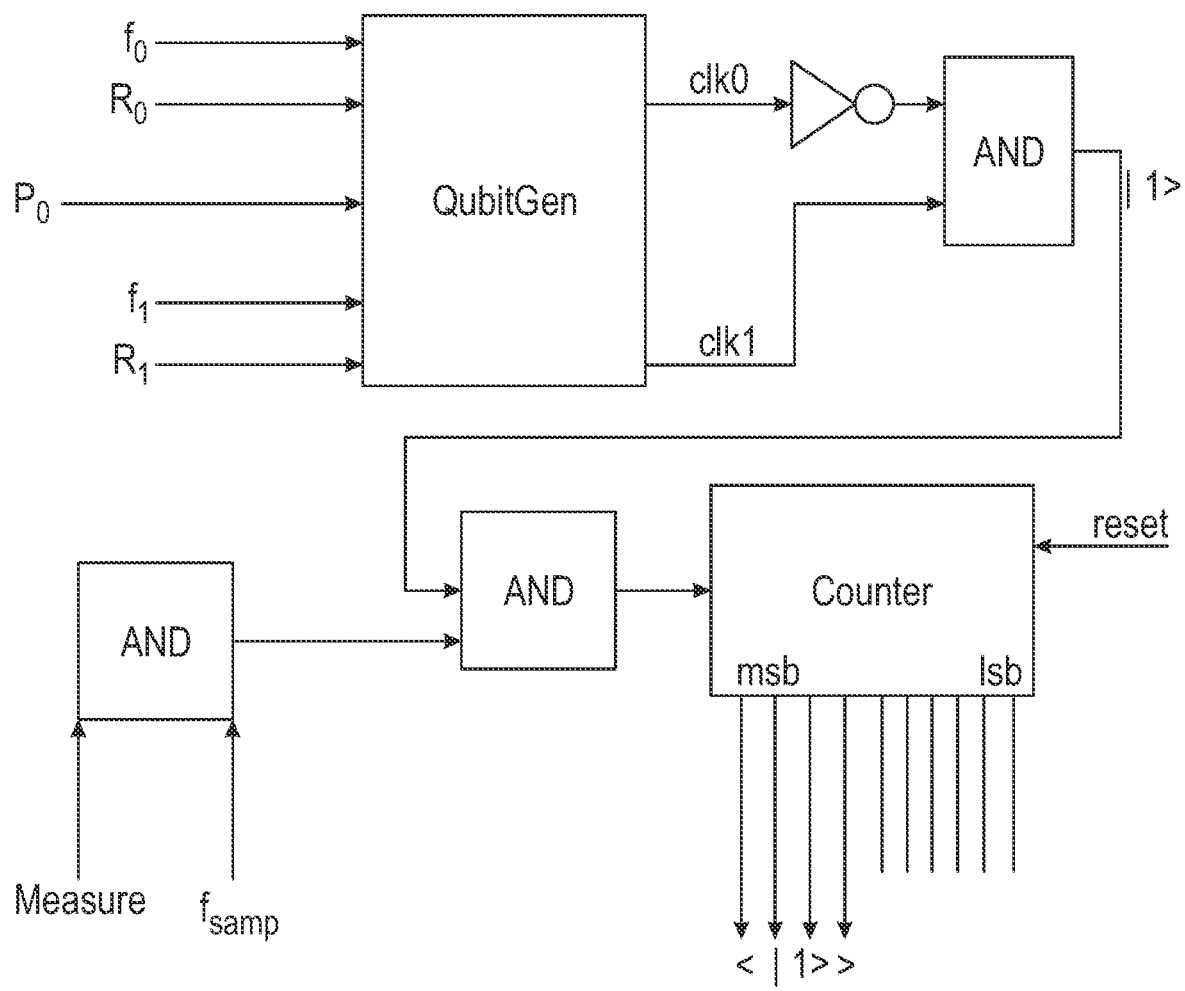
FIG. 15 depicts a circuit to measure the two states of a qubit as disclosed herein.

FIG. 15 depicts a block diagram for a circuit to measure the expectation value of one of the two qubit states, here $|1\rangle$. The sampling should be made using randomness (truly stochastic process) or at a sampling frequency higher than the qubit frequencies. In the latter case, the results should then be filtered to remove any aliasing effects. The qubit signal and the sampling signal are connected to an AND gate, which generates a high/on signal only when both the qubit signal and sampling signal are both high/on, that is, the sampling signal is detecting qubit $|1\rangle$ in an on state. Then, in any one second of sample time, the output of the counter is the number of times per second that the qubit is in the |1> state. This count is proportional to the probability that the qubit is in the |1>, which can be approximated by considering the most significant bits (msb) of the counter's output. FIG. 8 also depicts reset and measure control signals.

Much like with non-classical quantum computers, if 1 counter is used per output qubit signal, then for an N-qubit circuit, $2^N$ counters will be needed to measure all possible multi-qubit outcomes, which does not scale well. So, much like non-classical quantum computers, only a subset of the output qubit signals are measured in practice. A large subset of output qubit signals can be counted/measured, and/or stored in the memory of the controlling computer, for further analysis. Alternatively, multiplexers can be used to measure, possibly in real-time, the output of a smaller number of output qubit signals.

For a qubit for which its signals are not transformed, the probabilities of the measured outputs of the qubit generator will correspond to the square of the input probability that represents the qubit state.

Detailed Description—Technology Support from Data/Instructions to Processors/Programs Data and Information.

While 'data' and 'information' often are used interchangeably (e.g., 'data processing' and 'information processing'), the term 'datum' (plural 'data') typically signifies a representation of the value of a measurement of a physical quantity (e.g., the current in a wire), or the answer to a question (e.g., "yes" or "no"), while the term 'information' typically signifies a structured set of data (often times signified by 'data structure'). A specified data structure is used to structure an electronic device to be used as a specific machine as an article of manufacture (see In re Lowry, 32F. 3d 1579 [CAFC, 1994]). Data and information are physical, for example binary data (a 'bit', usually signified with '0' and '1') enabled with two different levels of voltage in a circuit. For example, data can be enabled as an electrical, magnetic, optical or acoustical signal; a quantum state such as spin that enables a 'qubit'; or a physical state of an atom or molecule. All such data and information, when enabled, are stored, accessed, transferred, combined, compared, or otherwise acted upon, actions that require energy.

As used herein, the term 'process' signifies an unnatural sequence of physical actions and/or transformations (both also referred to as 'operations' or 'steps') to produce at least one result. The actions and transformations are technical applications of one or more natural laws of science or unnatural laws of technology. The actions and transformations often change the physical state of a machine, of structures of data and information, or of a composition of matter. Two or more actions can occur at about the same time, or one action can occur before or after another action, if they produce the same result. A description of the physical actions and/or transformations that comprise a process are often signified with a set of gerund phrases (or their semantic equivalents) that are typically preceded with the signifier 'the steps of' (e.g., "a process comprising the steps of measuring, transforming, partitioning and then distributing . . . "). The signifiers 'algorithm', 'method', 'procedure', '(sub)routine', 'protocol', 'recipe', and 'technique' often are used interchangeably with 'process', and 35 U.S.C. 100 defines a "method" as one type of process that is, by statutory law, always patentable under 35 U S.C. 101. Many forms of knowledge, learning, skills and styles are authored, structured, and enabled objectively as processes—e.g., knowledge and learning as functions in knowledge programming languages. As used herein, the term 'rule' signifies a process with at least one conditional test (signified, e.g., by 'IF test THEN process'). As used herein, the term 'thread' signifies a sequence of operations or instructions that comprise a subset of an entire process. A process can be partitioned into multiple threads that can be used at or about at the same time.

As used herein, the term 'component' (also signified by 'part', and typically signified by 'element' when described in a patent text or diagram) signifies a physical object that is used to enable a process in combination with other components. For example, electronic components are used in processes that affect the physical state of one or more electromagnetic or quantum particles/waves (e.g., electrons, photons) or quasiparticles (e.g., electron holes, phonons, magnetic domains) and their associated fields or signals. Electronic components have at least two connection points to which are attached 'leads', typically a conductive wire or optical fiber, with one end attached to the component and the other end attached to another component, typically as part of a circuit with current flows. There are at least three types of electrical components: passive, active and electromechanical. Passive electronic components typically do not introduce energy into a circuit such components include resistors, memristors, capacitors, magnetic inductors, crystals, Josephson junctions, transducers, sensors, antennas, waveguides, etc. Active electronic components require a source of energy and can inject energy into a circuit such components include semiconductors (e.g., diodes, transistors, optoelectronic devices), vacuum tubes, batteries, power supplies, displays (e.g., LEDs, LCDs, lamps, CRTs, plasma displays). Electromechanical components affect current flow using mechanical forces and structures such components include switches, relays, protection devices (e.g., fuses, circuit breakers), heat sinks, fans, cables, wires, terminals, connectors and printed circuit boards. As used herein, the term 'netlist' is a specification of the components comprising an electric circuit, and electrical connections between the components. The programming language for the SPICE circuit simulation program is often used to specify a netlist. In the context of circuit design, the term 'instance' signifies each time a component is specified in a netlist.

One of the most important components as goods in commerce is the integrated circuit, and its res of abstractions. As used herein, the term 'integrated circuit' signifies a set of connected electronic components on a small substrate (thus the use of the signifier 'chip') of semiconductor material, such as silicon or gallium arsenide, with components fabricated on one or more layers. Other signifiers for 'integrated circuit' include 'monolithic integrated circuit', 'IC', 'chip', 'microchip' and 'System on Chip' ('SoC'). Examples of types of integrated circuits include gate/logic arrays, processors, memories, interface chips, power controllers, and operational amplifiers. The term 'cell' as used in electronic circuit design signifies a specification of one or more components, for example, a set of transistors that are connected to function as a logic gate. Cells are usually stored in a database, to be accessed by circuit designers and design processes.

As used herein, the term 'module' signifies a tangible structure for acting on data and information. For example, the term 'module' can signify a process that transforms data and information, for example, a process comprising a computer program. The term 'module' also can signify one or more interconnected electronic components, such as digital logic devices. A process comprising a module, if specified in a programming language, such as System C or Verilog, also can be transformed into a specification for a structure of electronic components that transform data and information that produce the same result as the process. This last sentence follows from a modified Church-Turing thesis, which is simply expressed as "Whatever can be transformed by a (patentable) process and a processor, can be transformed by a (patentable) equivalent set of modules.", as opposed to the doublethink of deleting only one of the "(patentable)".

A module is permanently structured (e.g., circuits with unalterable connections), temporarily structured (e.g., circuits or processes that are alterable with sets of data), or a combination of the two forms of structuring. Permanently structured modules can be manufactured, for example, using Application Specific Integrated Circuits ('ASICs') such as Arithmetic Logic Units ('ALUs'), Programmable Logic Arrays ('PLAs'), or Read Only Memories ('ROMs'), all of which are typically structured during manufacturing. For example, a permanently structured module can comprise an integrated circuit. Temporarily structured modules can be manufactured, for example, using Field Programmable Gate Arrays (FPGAs—for example, sold by Xilink or Intel's Altera), Random Access Memories (RAMs) or microprocessors. For example, data and information is transformed using data as an address in RAM or ROM memory that stores output data and information. One can embed temporarily structured modules in permanently structured modules (for example, a FPGA embedded into an ASIC).

Modules that are temporarily structured can be structured during multiple time periods. For example, a processor comprising one or more modules has its modules first structured by a manufacturer at a factory and then further structured by a user when used in commerce. The processor can comprise a set of one or more modules during a first time period, and then be restructured to comprise a different set of one or modules during a second time period. The decision to manufacture or implement a module in a permanently structured form, in a temporarily structured form, or in a combination of the two forms, depends on issues of commerce such as cost, time considerations, resource constraints, tariffs, maintenance needs, national intellectual property laws, and/or specific design goals. How a module is used is mostly independent of the physical form in which it is manufactured or enabled. This last sentence also follows from the modified Church-Turing thesis.

As used herein, the term 'processor' signifies a tangible data and information processing machine for use in commerce that physically transforms, transfers, and/or transmits data and information, using at least one process. A processor consists of one or more modules (e.g., a central processing unit, 'CPU'; an input/output ('I/O') controller, a memory controller, a network controller, and other modules). The term 'processor' can signify one or more processors, or one or more processors with multiple computational cores/CPUs, specialized processors (for example, graphics processors or signal processors), and their combinations. Where two or more processors interact, one or more of the processors can be remotely located. Where the term 'processor' is used in another context, such as a 'chemical processor', it will be signified and defined in that context.

The processor can comprise, for example, digital logic circuitry (for example, a binary logic gate), and/or analog circuitry (for example, an operational amplifier). The processor also can use optical signal processing, DNA transformations or quantum operations, microfluidic logic processing, or a combination of technologies, such as an optoelectronic processor. For data and information structured with binary data, any processor that can transform data and information using the AND, OR and NOT logical operations (and their derivatives, such as the NAND, NOR, and XOR operations) also can transform data and information using any function of Boolean logic. A processor such as an analog processor, such as an artificial neural network, also can transform data and information. No scientific evidence exists that any of these technological processors are processing, storing and retrieving data and information, using any process or structure equivalent to the bioelectric structures and processes of the human brain.

The one or more processors also can use a process in a 'cloud computing' environment, where time and resources of multiple remote computers are shared by multiple users or processors communicating with the computers. For example, a group of processors can use at least one process available at a distributed or remote system, these processors using a communications network (e.g., the Internet, or an Ethernet) and using one or more specified interfaces (e.g., an application program interface ('API') that signifies functions and data structures to communicate with the remote process).

As used herein, the term 'computer' and 'computer system' (further defined below) includes at least one processor that, for example, performs operations on data and information such as (but not limited to) the AND, OR and NOT logical operations using electronic gates that can comprise transistors, with the addition of memory (for example, memory structured with flip-flops using the NOT-AND or NOT-OR operation). Such a processor is Turing-complete and computationally universal. A computer can comprise a simple structure, for example, comprising an I/O module, a CPU, and a memory that performs, for example, the process of inputting a signal, transforming the signal, and outputting the signal with no human intervention.

As used herein, the term 'programming language' signifies a structured grammar for specifying sets of operations and data for use by modules, processors and computers. Programming languages include assembler instructions, instruction-set-architecture instructions, machine instructions, machine dependent instructions, microcode, firmware instructions, state-setting data, or either source code or object code written in any combination of one or more higher level languages, for example, the C programming language and similar general programming languages (such as Fortran, Basic, Javascript, PHP, Python, C++), knowledge programming languages (such as Lisp, Smalltalk, Prolog, or CycL), electronic structure programming languages (such as VHDL, Verilog, SPICE or SystemC), text programming languages (such as SGML, HTML, or XML), or audiovisual programming languages (such as SVG, MathML, X3D/VRML, or MIDI), and any future equivalent programming languages. As used herein, the term 'source code' signifies a set of instructions and data specified in text form using a programming language. A large amount of source code for use in enabling any of the claimed inventions is available on the Internet, such as from a source code library such as Github.

As used herein, the term 'program' (also referred to as an 'application program') signifies one or more processes and data structures that structure a module, processor or computer to be used as a "specific machine" (see In re Alappat, 33 F3d 1526 [CAFC, 1991]). One use of a program is to structure one or more computers, for example, standalone, client or server computers, or one or more modules, or systems of one or more such computers or modules. As used herein, the term 'computer application' signifies a program that enables a specific use, for example, to enable text processing operations, or to encrypt a set of data. As used herein, the term 'firmware' signifies a type of program that typically structures a processor or a computer, where the firmware is smaller in size than a typical application program, and is typically not very accessible to or modifiable by the user of a computer. Computer programs and firmware are often specified using source code written in a programming language, such as C. Modules, circuits, processors, programs and computers can be specified at multiple levels of abstraction, for example, using the SystemC programming language, and have value as products in commerce as taxable goods under the Uniform Commercial Code (see U.C.C. Article 2, Part 1).

A program is transferred into one or more memories of the computer or computer system from a data and information device or storage system. A computer system typically has a device for reading storage media that is used to transfer the program, and or has an interface device that receives the program over a network. This process is discussed in the General Computer Explanation section.

Detailed Description—Technology Support General Computer Explanation

FIGS. 16A, 16B and 16C are abstract diagrams of a computer system suitable for enabling embodiments of the claimed inventions.

In FIG. 16A, the structure of computer system 3110 typically includes at least one computer 3114 which communicates with peripheral devices via bus subsystem 3112. Typically, the computer includes a processor (e.g., a microprocessor, graphics processing unit, or digital signal processor), or its electronic processing equivalents, such as an Application Specific Integrated Circuit ('ASIC') or Field Programmable Gate Array ('FPGA'). Typically, peripheral devices include a storage subsystem 3124, comprising a memory subsystem 3126 and a file storage subsystem 3128, user interface input devices 3122, user interface output devices 3120, and/or a network interface subsystem 3116. The input and output devices enable direct and remote user interaction with computer system 3110. The computer system enables significant post-process activity using at least one output device and/or the network interface subsystem.

The computer system can be structured as a server, a client, a workstation, a mainframe, a personal computer (PC), a tablet PC, a set-top box (STB), a personal digital assistant (PDA), a cellular telephone, a smartphone, a web appliance, a rack-mounted 'blade', a kiosk, a television, a game station, a network router, switch or bridge, or any data processing machine with instructions that specify actions to be taken by that machine. The term 'server', as used herein, refers to a computer or processor that typically performs processes for, and sends data and information to, another computer or processor.

A computer system typically is structured, in part, with at least one operating system program, such as Microsoft's Windows, Sun Microsystems's Solaris, Apple Computer's MacOs and iOS, Google's Android, Linux and/or Unix. The computer system typically includes a Basic Input/Output System (BIOS) and processor firmware. The operating system, BIOS and firmware are used by the processor to structure and control any subsystems and interfaces connected to the processor. Typical processors that enable these operating systems include: the Pentium, Itanium and Xeon processors from Intel; the Opteron and Athlon processors from AdvancedMicro Devices; the Graviton processor from Amazon; the POWER processor from IBM; the SPARC processor from Oracle; and the ARM processor from ARM Holdings.

The claimed inventions and their embodiments are limited neither to an electronic digital logic computer structured with programs nor to an electronically programmable device. For example, the claimed inventions can use an optical computer, a quantum computer, an analog computer, or the like. Further, where only a single computer system or a single machine is signified, the use of a singular form of such terms also can signify any structure of computer systems or machines that individually or jointly use processes. Due to the ever-changing nature of computers and networks, the description of computer system 3110 depicted in FIG. 16A is intended only as an example. Many other structures of computer system 3110 have more or less components than the computer system depicted in FIG. 16A.

Network interface subsystem 3116 provides an interface to outside networks, including an interface to communication network 3118, and is coupled via communication network 3118 to corresponding interface devices in other computer systems or machines. Communication network 3118 can comprise many interconnected computer systems, machines and physical communication connections (signified by 'links'). These communication links can be wireline links, optical links, wireless links (e.g., using the WiFi or Bluetooth protocols), or any other physical devices for communication of information. Communication network 3118 can be any suitable computer network, for example a wide area network such as the Internet, and/or a local-to-wide area network such as Ethernet. The communication network is wired and/or wireless, and many communication networks use encryption and decryption processes, such as is available with a virtual private network. The communication network uses one or more communications interfaces, which receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. Communication algorithms ('protocols') can be specified using one or communication languages, such as HTTP, TCP/IP, RTP/RTSP, IPX and/or UDP.

User interface input devices 3122 can include an alphanumeric keyboard, a keypad, pointing devices such as a mouse, trackball, toggle switch, touchpad, stylus, a graphics tablet, an optical scanner such as a bar code reader, touchscreen electronics for a display device, audio input devices such as voice recognition systems or microphones, eye-gaze recognition, brainwave pattern recognition, optical character recognition systems, and other types of input devices. Such devices are connected by wire or wirelessly to a computer system. Typically, the term 'input device' signifies all possible types of devices and processes to transfer data and information into computer system 3110 or onto communication network 3118. User interface input devices typically enable a user to select objects, icons, text and the like that appear on some types of user interface output devices, for example, a display subsystem.

User interface output devices 3120 can include a display subsystem, a printer, a fax machine, or a non-visual communication device such as audio and haptic devices. The display subsystem can include a cathode ray tube (CRT), a flat-panel device such as a liquid crystal display (LCD), an image projection device, or some other device for creating visible stimuli such as a virtual reality system. The display subsystem also can provide non-visual stimuli such as via audio output, aroma generation, or tactile/haptic output (e.g., vibrations and forces) devices. Typically, the term 'output device' signifies all possible types of devices and processes to transfer data and information out of computer system 3110 to the user or to another machine or computer system. Such devices are connected by wire or wirelessly to a computer system. Note: some devices transfer data and information both into and out of the computer, for example, haptic devices that generate vibrations and forces on the hand of a user while also incorporating sensors to measure the location and movement of the hand. Technical applications of the sciences of ergonomics and semiotics are used to improve the efficiency of user interactions with any processes and computers disclosed herein, such as any interactions with regards to the design and manufacture of circuits, that use any of the above input or output devices.

Memory subsystem 3126 typically includes a number of memories including a main random-access memory ('RAM') 3130 (or other volatile storage device) for storage of instructions and data during program execution and a read only memory ('ROM') 3132 in which fixed instructions are stored. File storage subsystem 3128 provides persistent storage for program and data files, and can include a hard disk drive, a floppy disk drive along with associated removable media, a CD-ROM drive, an optical drive, a flash memory such as a USB drive, or removable media cartridges. If computer system 3110 includes an input device that performs optical character recognition, then text and symbols printed on paper can be used as a device for storage of program and data files. The databases and modules used by some embodiments can be stored by file storage subsystem 3128.

Bus subsystem 3112 provides a device for transmitting data and information between the various components and subsystems of computer system 3110. Although bus subsystem 3112 is depicted as a single bus, alternative embodiments of the bus subsystem can use multiple busses. For example, a main memory using RAM can communicate directly with file storage systems using Direct Memory Access ('DMA') systems.

FIG. 16B depicts a memory 3140 such as a non-transitory, processor readable data and information storage medium associated with file storage subsystem 3128, and/or with network interface subsystem 3116, and can include a data structure specifying a circuit design. The memory 3140 can be a hard disk, a floppy disk, a CD-ROM, an optical medium, removable media cartridge, or any other medium that stores computer readable data in a volatile or non-volatile form, such as text and symbols on paper that can be processed by an optical character recognition system. A program transferred in to and out of a processor from such a memory can be transformed into a physical signal that is propagated through a medium (such as a network, connector, wire, or circuit trace as an electrical pulse); or through a medium such as space or an atmosphere as an acoustic signal, or as electromagnetic radiation with wavelengths in the electromagnetic spectrum longer than infrared light).

FIG. 16C signifies an article of manufacture, for example, an integrated circuit (element 3190) created by using one or more of the claimed inventions and their tangible forms that are specified by the Specification and Figures.

Detailed Description—Technology Support EDA System/Workflow Explanation

Figure 16:
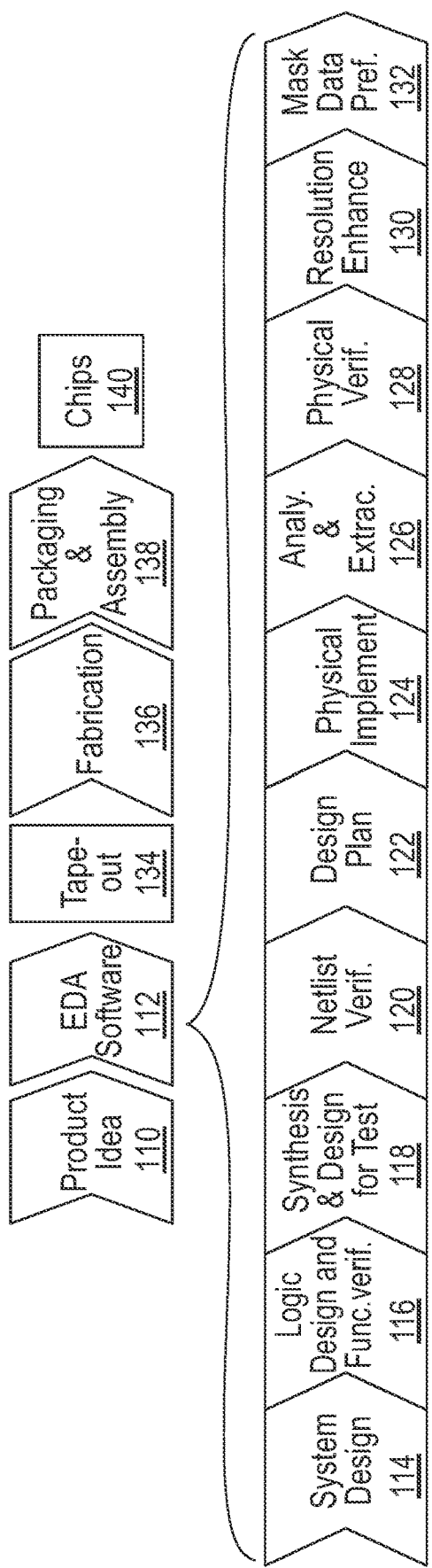
FIG. 16 depicts a flowchart of various processes used during the design and manufacture of an integrated circuit.

FIG. 16 depicts a set of processes 30-100 used during the design, verification and fabrication of an article of manufacture such as an integrated circuit to transform and verify design data and instructions that represent the integrated circuit. Each of these processes can be structured and enabled as multiple modules. The term 'EDA' signifies the term 'Electronic Design Automation'. These processes start with the creation of a product idea 30-110 with information supplied by a designer, information which is transformed to create an article of manufacture that uses a set of EDA processes 30-112. When the design is finalized, it is taped-out 30-134, which typically is when artwork (e. g., geometric patterns) for the integrated circuit is sent to a fabrication facility to manufacture the mask set, which is then used to manufacture the integrated circuit. After tape-out, a semiconductor die is manufactured 30-136 and packaging and assembly processes 30-138 are performed to produce the finished integrated circuit 30-140.

Specifications for a circuit or electronic structure are a res used in commerce at multiple levels of useful abstraction ranging from low-level transistor material layouts to high-level description languages. Most designers start with a description using one or more modules with less detail at a high-level of abstraction to design their circuits and systems, using a hardware description language ('HDL') such as VHDL, Verilog, SystemVerilog, SystemC, MyHDL or OpenVera. The high-level description is easier for designers to understand, especially for a vast system, and can describe very complex systems that are difficult to understand using a lower level of abstraction that is a more detailed description. The HDL description can be transformed into other levels of abstraction that are used by the developers. For example, a high-level description can be transformed to a logic-level register transfer level ('RTL') description, a gate-level description, a layout-level description, or a mask-level description. Each lower abstraction level that is a less abstract description adds more useful detail into the design description, for example, more details for the modules that comprise the description. The lower-levels of abstraction that are less abstract descriptions can be generated by a computer, derived from a design library, or created by another design automation process. An example of a specification language at a lower level of abstraction language for specifying more detailed descriptions is SPICE, which is much used for detailed descriptions of circuits with many analog components. A circuit specification for a circuit also has value as an article of manufacture in commerce as a good under the Uniform Commercial Code (see U.C.C. Article 2, Part 1). Descriptions at each level of abstraction are enabled for use by the corresponding tools of that layer (for example, a formal verification tool), and some of the modules of the abstractions need not be novel or unobvious.

A design process that uses EDA processes 30-112 includes processes 30-114 to 30-132, which are described below. This design flow description is used only to illustrate, not to limit. For example, a designer of an integrated circuit design can use the design processes in a different sequence than the sequence depicted in FIG. 16. For the embodiments disclosed herein, products from Synopsys, Inc. of Mountain View, Calif. (hereinafter signified by 'Synopsys'), are used to enable these processes, and/or similar products from other companies.

During system design 30-114, a designer specifies the functionality to be manufactured. The designer also can optimize the power, performance and area (physical and/or lines of code) and minimize costs, etc. Partitioning of the design into different types of modules can occur at this stage. Exemplary EDA products from Synopsys that enable system design 30-114 include: the Model Architect, Saber, System Studio, and Designware products.

During logic design and functional verification 30-116, modules in the circuit are specified in one or more description languages, and the specification is checked for functional accuracy, that is, that the modules produce outputs that match the requirements of the specification of the circuit or system being designed. Exemplary HDL languages are Verilog, VHDL and SystemC. Functional verification typically uses simulators and other programs such as test bench generators, static HDL checkers and formal verifiers. In some situations, special systems of modules referred to as 'emulators' or 'prototyping systems' are used to speed up the functional verification. Exemplary EDA products from Synopsys that can be used at this stage include: VCS Vera, Designware, Magellan, Formality, ESP and Leda products. Exemplary emulator and prototyping products available from Synopsys that enable logic design and functional verification 30-116 include: Zebu® and Protolink® (RTM signifies 'Registered Trademark').

During synthesis and design for test 30-118, HDL code is transformed to a netlist (which typically is a graph structure where the edges represent components of a circuit and where the nodes represent how the components are interconnected). Both the HDL code and the netlist are hierarchical articles of manufacture that can be used by an EDA product to verify that the integrated circuit, when manufactured, performs according to its design. This netlist can be optimized for a target semiconductor manufacturing technology. Additionally, the finished integrated circuit is tested to verify that it satisfies the requirements of the specification. Exemplary EDA products from Synopsys that enable synthesis and design for test 30-118 include: the Design Compiler, Physical Compiler, Test Compiler, Power Compiler, FPGA Compiler, Tetramax, and Designware products.

During netlist verification 30-120, the netlist is checked for compliance with timing constraints and for correspondence with the HDL code. Exemplary EDA products from Synopsys that enable netlist verification 30-120 include: the Formality, Primetime, and VCS products.

During design planning 30-122, an overall floor plan for the integrated circuit is constructed and analyzed for timing and top-level routing. Exemplary EDA products from Synopsys that enable design planning 30-122 include: the Astro and IC Compiler products.

During layout implementation 30-124, physical placement (positioning of circuit components such as transistors or capacitors) and routing (connection of the components by multiple conductors) occurs, and the selection of cells from a library to enable specific logic functions. As used herein, the term 'cell' signifies a set of transistors, other components, and interconnections that provides a Boolean logic function (e.g., AND, OR, NOT, XOR) or a storage function (such as a flipflop or latch). As used herein, a circuit 'block' comprises two or more cells. Both a cell and a circuit block can be referred to as a module, and are enabled as both physical structures and in simulations. Parameters are specified for selected cells (based on 'standard cells') such as size, and made accessible in a database for use by EDA products. Examples of databases that can be used for accessing cells include MySQL and PostgreSQL. Exemplary EDA products from Synopsys that enable layout implementation 30-124 include: the Astro and IC Compiler products.

During analysis and extraction 30-126, the circuit function is verified at the layout level, which permits refinement of the layout design. Exemplary EDA products from Synopsys that enable analysis and extraction 30-126 include: the Astrorail, Primerail, Primetime, and Star RC/XT products.

During physical verification 30-128, the layout design is checked to ensure that manufacturing constraints are correct, such as DRC constraints, electrical constraints, lithographic constraints, and that circuitry function matches the HDL design specification. Exemplary EDA products from Synopsys that enable physical verification 30-128 include: the Hercules product.

During resolution enhancement 30-130, the geometry of the layout is transformed to improve how the design is manufactured. Exemplary EDA products from Synopsys that enable resolution enhancement 30-130 include: the Proteus product.

During tape-out, data is created to be used (after lithographic enhancements are applied if appropriate) for production of lithography masks. Example EDA products from Synopsys that enable tape-out include: the IC Compiler and Custom Designer products.

During mask-data preparation 30-132, the 'tape-out' data is used to produce lithography masks that are used to produce finished integrated circuits. Exemplary EDA products from Synopsys that enable mask-data preparation 30-132 include: the CATS family of products.

For all of the abovementioned EDA products, similar products from other EDA vendors, such as Cadence, Siemens, other corporate entities or various non-commercial products from universities, or open source repositories, can be used as an alternative.

A storage subsystem of a computer system (such as computer system 3110 of FIG. 16A) is preferably used to store the programs and data structures that are used by some or all of the EDA products described herein, and products used for development of cells for the library and for physical and logical design that use the library.

Detailed Description—Semantic Support

The signifier 'commercial solution' signifies, solely for the following paragraph, an engineering domain-specific (and thus non-preemptive see Bilski): electronic structure, a process for a specified machine, a manufacturable circuit (and their Church-Turing equivalents) or a composition of matter that applies science and/or technology for use in commerce to solve a technical problem.

The signifier 'abstract' (when used in a patent claim for any enabled embodiments disclosed herein for a new commercial solution that is a scientific use of one or more laws of nature {see Benson}, and that solves a problem of technology {see Diehr} for use in commerce—or improves upon an existing solution used in commerce {see Diehr})—is precisely defined by the inventor(s) {see MPEP 2111.01 (9th edition, Rev. 08.2017)} as follows:

a) a new commercial solution is 'abstract' if it is not novel (e. g., it is so well known in equal prior art {see Alice} and/or the use of equivalent prior art solutions is long prevalent {see Bilski} in science, engineering or commerce), and thus unpatentable under 35 U.S.C. 102, for example, because it is 'difficult to understand' {see Merriam-Webster definition for 'abstract'} how the commercial solution differs from equivalent prior art solutions; or b) a new commercial solution is 'abstract' if the existing prior art includes at least one analogous prior art solution {see KSR}, or the existing prior art includes at least two prior art publications that can be combined {see Alice} by a skilled person {often referred to as a 'PHOSITA', see MPEP 2141-2144 (9th edition, Rev. 08.2017)} to be equivalent to the new commercial solution, and is thus unpatentable under 35 U.S.C. 103, for example, because it is 'difficult to understand' how the new commercial solution differs from a PHOSITA-combination/-application of the existing prior art; or c) a new commercial solution is 'abstract' if it is not disclosed with a description that enables its praxis, either because insufficient guidance exists in the description, or because only a generic implementation is described {see Mayo} with unspecified components, parameters or functionality, so that a PHOSITA is unable to instantiate an embodiment of the new solution for use in commerce, without, for example, requiring special programming {see Katz}(or, e.g., circuit design) to be performed by the PHOSITA, and is thus unpatentable under 35 U.S.C. 112, for example, because it is 'difficult to understand' how to use in commerce any embodiment of the new commercial solution.

Detailed Description—Definitions

As used herein, the semiotic function RUD(t, p1, p2, . . . ) signifies that a skilled person can obtain, if needed for progressing the useful arts, a reasonably useful definition of the signifier 't' that comprises the union of definitions of 't' in one or more US. Patents and US. Patent Applications 'p1', 'p2', etc. For example, 'RUD(substantially, 9532624)' signifies that a skilled person can obtain a reasonably useful definition of 'substantially' as it is defined in US. Patent 9,532, 624.

DEFINITIONS: RUD(substantially, 9532624).

DETAILED DESCRIPTION—CONCLUSION

The Detailed Description signifies in isolation the individual features, structures, functions, or characteristics described herein and any combination of two or more such features, structures, functions or characteristics, to the extent that such features, structures, functions or characteristics or combinations thereof are enabled by the Detailed Description as a whole in light of the knowledge and understanding of a skilled person, irrespective of whether such features, structures, functions or characteristics, or combinations thereof solve any problems disclosed herein, and without limitation to the scope of the Claims of the patent. When an embodiment of a claimed invention comprises a particular feature, structure, function or characteristic, it is within the knowledge and understanding of a skilled person to use such feature, structure, function, or characteristic in connection with other embodiments whether or not explicitly described, for example, as a substitute for another feature, structure, function or characteristic.

In view of the Detailed Description, a skilled person will understand that many variations of the claimed inventions can be enabled, such as function and structure of elements, described herein while remaining in the domain of the claimed inventions. One or more elements of an embodiment can be substituted for one or more elements in another embodiment, as will be understood by a skilled person. Writings about embodiments signify their uses in commerce, thereby enabling other skilled people to similarly use in commerce.

This Detailed Description is fitly written to provide knowledge and understanding. It is neither exhaustive nor limiting of the precise structures described, but is to be accorded the widest scope consistent with the disclosed principles and features. A skilled person can enable many equivalent variations. Without limitation, any and all equivalents described, signified or Incorporated By Reference in this patent application are specifically Incorporated By Reference into the Detailed Description. In addition, any and all variations described, signified or Incorporated By Reference with respect to any one claimed invention and its embodiment also are included with all other claimed inventions and their embodiments. Any such variations include both currently known variations as well as future variations, for example any element used for enablement includes a future equivalent element that provides the same function, regardless of the structure of the future equivalent element.

It is intended that the domain of the set of claimed inventions and their embodiments be defined and judged by the following Claims and their equivalents. The Detailed Description includes the following Claims, with each Claim standing on its own as a separate claimed invention. The embodiments of the claimed inventions can have more structure and features than are explicitly specified in the Claims.

What is claimed:

1. A quantum computing system comprising a semiconductor circuit configured to generate:
    a first clock signal having a first frequency and a first duty cycle, said first clock signal representing a first state of a first non-superconducting qubit of the quantum computing system; and
    a second clock signal having a second frequency and a second duty cycle, said second clock signal representing a second state of the first non-superconducting qubit, wherein a sum of the first and second duty cycles is one.

2. The quantum computing system of claim 1 wherein said semiconductor circuit is further configured to generate:
    a third clock signal having a third frequency and a third duty cycle, said third clock signal representing a first state of a second non-superconducting qubit of the quantum computing system; and
    a fourth clock signal having a fourth frequency and a fourth duty cycle, said fourth clock signal representing a second state of the second non-superconducting qubit, wherein a sum of the third and fourth duty cycles is one.

3. The quantum computing system of claim 2 further comprising
    one or more phase locked loops adapted to generate the first, second, third and fourth clock signals.

4. The quantum computing system of claim 3 further comprising:
    a counter adapted to measure a state of the first qubit.

5. A method of performing a numerical or logical operation, the method comprising:
    submitting a request for the operation to a quantum computing system via a network, said quantum computing system comprising a semiconductor circuit configured to generate a first clock signal having a first frequency and a first duty cycle and a second clock signal having a second frequency and a second duty cycle, said first and second clock signals respectively representing first and second states of a first non-superconducting qubit of the quantum computing system; and
    receiving a result of the operation from the quantum computing system.

6. The method of claim 5 wherein said quantum computing system is further configured to generate a third clock signal having a third frequency and a third duty cycle and a fourth clock signal having a fourth frequency and a fourth duty cycle, said third and fourth clock signals respectively representing first and second states of a second non-superconducting qubit of the quantum computing system.

7. The method of claim 6 wherein said quantum computing system further comprises one or more phase locked loops adapted to generate the first, second, third and fourth clock signals.

8. The method of claim 6 wherein said quantum computing system further comprises a counter adapted to measure a state of the first non-superconducting qubit.

\* \* \* \* \*